United States Patent
Aoki et al.

(10) Patent No.: US 6,864,133 B2
(45) Date of Patent: Mar. 8, 2005

(54) DEVICE, METHOD OF MANUFACTURING DEVICE, ELECTRO-OPTIC DEVICE, AND ELECTRONIC EQUIPMENT

(75) Inventors: Takashi Aoki, Suwa (JP); Masahiro Furusawa, Chino (JP); Ichio Yudasaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/420,359

(22) Filed: Apr. 22, 2003

(65) Prior Publication Data

US 2003/0234398 A1 Dec. 25, 2003

(30) Foreign Application Priority Data

Apr. 22, 2002 (JP) ........................................ 2002-119964

(51) Int. Cl.[7] ............................................. H01L 21/336
(52) U.S. Cl. ....................... 438/197; 257/262; 257/368; 438/135; 438/151; 438/201; 438/207; 438/216
(58) Field of Search ................................. 438/133, 152, 438/197; 257/262, 368

(56) References Cited

U.S. PATENT DOCUMENTS

| 4,838,991 | A  | * | 6/1989  | Cote et al. ..................... 216/46 |
| 6,248,637 | B1 | * | 6/2001  | Yu .............................. 438/300 |
| 6,479,838 | B2 | * | 11/2002 | Morosawa ..................... 257/72 |
| 6,541,354 | B1 | * | 4/2003  | Shimoda et al. ............. 438/478 |

* cited by examiner

Primary Examiner—Long Pham
Assistant Examiner—Wai-Sing Louie
(74) Attorney, Agent, or Firm—Harness, Dickey & Pierce, P.L.C.

(57) ABSTRACT

A device comprising a semiconductor film (12) formed on a substrate (11), a gate region (15), in which a gate insulating film (13) formed on the semiconductor film and a gate electrode film (14) are laminated, isolation means (A) formed on both sides of the gate region to prevent contact between the gate electrode film and other regions, and a source region and a drain region formed by baking a liquid semiconductor material (17) and disposed on regions on the substrate and on both sides of the gate region.

19 Claims, 21 Drawing Sheets

(a)

(b)

DEVICE, METHOD OF MANUFACTURING DEVICE, ELECTRO-OPTIC DEVICE, AND ELECTRONIC EQUIPMENT

BACKGROUND OF THE INVENTION

1. Technical Field

The present invention relates to a device comprising a thin-film transistor used for electro-optic devices such as liquid crystal displays, plasma displays, organic EL displays, or the like, and various electronic equipment, and a method of manufacturing the device, and more particularly, to a device making use of a liquid material, and a method of manufacturing the device.

2. Related Art

A thin-film transistor (TFT) comprises, for example, a substrate, semiconductor film, gate electrode, source electrode, drain electrode, gate insulating film, interlaminar (e.g., interlayer) insulating film, and a protective film. With a coplanar type TFT, in which a source region and a drain region, respectively, are formed on both sides of a gate, ion implantation is applied to a semiconductor film with a gate electrode film (or a gate portion) as a mask, and heat treatment is performed to form a source region and a drain region, which are doped at high concentration. Thereby, the source region and the drain region are formed in self-alignment without the use of any ion implantation mask.

However, an expensive and huge ion implantation apparatus is required for ion implantation directed to formation of highly concentrated doped regions, such as the source region, drain region, or the like.

Accordingly, the invention has an object to provide a device, in which a highly concentrated doped semiconductor region is formed on a semiconductor film without resorting to ion implantation.

Also, the invention has an object to provide a method of manufacturing a device, the method being capable of forming a highly concentrated doped semiconductor layer on a semiconductor film without the use of any ion implantation apparatus.

Also, the invention has an object to provide a device structured such that when a source region and a drain region are formed on a semiconductor film, short-circuiting is prevented between these regions and a gate electrode.

Also, the invention has an object to provide a method of manufacturing a device, which can be structured such that when a source region and a drain region are formed on a semiconductor film, short-circuiting is prevented between these regions and a gate electrode.

SUMMARY

In order to attain the objects, the invention provides a device comprising a semiconductor film formed on a substrate, a gate region in which a gate insulating film formed on the semiconductor film and a gate electrode film are laminated, isolation means formed on both sides of the gate region to prevent contact between the gate electrode film and other regions, and a source region and a drain region formed from a liquid semiconductor material to be disposed on regions on the substrate and on both sides of the gate region.

With such structure, a semiconductor device is obtained, in which a liquid semiconductor material is used to easily form a source region and a drain region. Also, it is possible to manufacture a semiconductor device without the use of any ion implantation apparatus.

Preferably, the isolation means comprises a liquid repellent film formed on both sides of the gate region. The liquid repellent film repels a liquid semiconductor material from side walls of the gate region to thereby make it possible to avoid contact between the liquid semiconductor material and the gate electrode film.

Preferably, the isolation means comprises an insulating film formed on both sides of the gate region. Thereby, side walls of the gate region are made insulative to thereby make it possible to avoid electric and physical contact between the liquid semiconductor material and the gate electrode film.

Preferably, the isolation means comprises an insulating film formed by anodizing the gate electrode film. The gate electrode film is made of, for example, aluminum. Thereby, an outer periphery of the gate electrode film is covered with an oxide to isolate the gate electrode film from other components.

Preferably, the isolation means comprises portions of the semiconductor film removed (trenched) on both sides of the gate region. Thereby, the gate electrode film and a coated film of the liquid semiconductor material are spaced away from each other in a vertical direction.

Preferably, the isolation means comprises portions of the substrate removed on both sides of the gate region. Thereby, the gate electrode film and a coated film of the liquid semiconductor material are spaced away from each other in a vertical direction.

In addition, both the semiconductor film and the substrate may be trenched to space the gate electrode film and a coated film of the liquid semiconductor material far away from each other in a vertical direction.

Preferably, the respective trenched portions form grooves, and the source region and the drain region are formed in the respective grooves. The grooves enable forming a source region and a drain region, which are minutely controlled in structure.

Preferably, the liquid semiconductor material contains a silane compound and a dopant source.

Preferably, the liquid semiconductor material contains a silane of higher order obtained by irradiating ultraviolet rays on a solution of a silane compound to cause photopolymerization, and a dopant source. Also, the liquid semiconductor material contains a silane of higher order obtained by irradiating ultraviolet rays on a solution containing a silane compound and a dopant source. Thereby, a silane of higher order doped at high concentration can be obtained by appropriate irradiation of ultraviolet rays.

Preferably, the liquid semiconductor material is a solution containing a silane compound and a dopant source containing a substance containing an element of group IIIB in the periodic table, or a substance containing an element of group VB.

Preferably, the silane compound has at least a cyclic structure in the molecules thereof. The compound having the cyclic structure is liable to be made a silane of higher order with photopolymerization.

Preferably, the semiconductor material is a solution containing a silane of higher order obtained by irradiating ultraviolet rays on a solution containing a silane compound and a dopant source containing a substance containing an element of group IIIB in the periodic table, or an element of group VB to make photopolymerization of the same, or a solution containing a silane of higher order obtained by irradiating ultraviolet rays on a silane compound solution to make photopolymerization of the same, and a dopant source containing a substance containing an element of group IIIB in the periodic table, or an element of group VB.

The silane of higher order obtained by photopolymerization exhibits very excellent adhesion to a substrate and so can be very neatly coated on the substrate. The silane of higher order is poor in reactivity and can be dealt with safely. Also, since the silane of higher order has a higher boiling point than its decomposition point, it is prevented from being inconveniently evaporated before formation of a silicon film at the time of heating and baking in the case where the silicon film is to be formed.

Also, an electro-optic device according to the invention comprises the above device.

Also, an electronic equipment according to the invention comprises the above electro-optic device.

The invention provides a method of manufacturing a device, comprising a semiconductor film forming step of forming a semiconductor film on a substrate, a gate region forming step of forming a gate region, in which a gate insulating film formed on the semiconductor film and a gate electrode film are laminated, an isolation means forming step of forming isolation means on both sides of the gate region to prevent contact between the gate electrode film and other regions, a coating step of coating a liquid semiconductor material on regions on the substrate and on both sides of the gate region, and a source region and drain region forming step of forming a source region and a drain region from a coated film of the liquid semiconductor material.

With such structure, it is possible to avoid contact between the liquid semiconductor material and the gate electrode film.

Preferably, the isolation means comprises a liquid repellent film formed on both sides of the gate region. Thereby, the liquid semiconductor material is repelled from the gate side walls to be prevented from contacting with the gate electrode film.

Preferably, the isolation means comprises an insulating film formed on both sides of the gate region. Thereby, the gate electrode film and the liquid semiconductor material are electrically isolated from each other.

Preferably, the isolation means comprises an insulating film formed by anodizing the gate electrode film. Aluminum having an insulating oxide film has an advantage that an insulating film can be formed in fewer processing steps.

Preferably, the isolation means comprises portions of the semiconductor film trenched on both sides of the gate region. Thereby, the gate electrode film and the liquid semiconductor material are spaced from each other in a vertical direction.

Preferably, the isolation means comprises portions of the substrate trenched on both sides of the gate region. Thereby, the gate electrode film and the liquid semiconductor material are spaced from each other in a vertical direction. Both the semiconductor film and the substrate may be trenched to be spaced from each other.

Preferably, the trenched portions define grooves, and the liquid semiconductor material is coated into the grooves. Thereby, the grooves enable forming a source region and a drain region, which are minutely controlled in structure.

Preferably, the liquid semiconductor material is a solution containing a silane compound and a dopant source containing a substance containing an element of group IIIB in the periodic table, or an element of group VB.

More preferably, the liquid semiconductor material is a solution containing a silane compound and a dopant source containing a substance containing an element of group IIIB in the periodic table, or an element of group VB, or a solution containing a silane of higher order obtained by irradiating ultraviolet rays on a silane compound solution to make photopolymerization of the same, and a dopant source containing a substance containing an element of group IIIB in the periodic table, or an element of group VB.

The silane of higher order obtained by photopolymerization exhibits very excellent adhesion to a substrate and so can be very neatly coated on the substrate. The silane of higher order is poor in reactivity and can be dealt with safely. Also, since the silane of higher order has a higher boiling point than its decomposition point, it is prevented from being inconveniently evaporated before formation of a silicon film at the time of heating and baking in the case where the silicon film is to be formed.

Preferably, the liquid semiconductor material is coated in a desired position by means of a droplet discharge (ink jet) method. In this case, in order to accurately discharge droplets, a known method such as mixing of a solvent, mixing of a surface tension conditioner, or the like can be used to adjust the viscosity and surface tension to such a degree that the liquid semiconductor material is not functionally damaged. In this manner, the liquid material is coated by means of the droplet discharge method whereby a semiconductor device with a good performance can be fabricated with less material.

Preferably, the step of forming a source region and a drain region from the liquid semiconductor material comprises a first heat treatment of relatively low temperature to remove a solvent from the coated film of the liquid semiconductor material, and a second heat treatment step, in which the coated film, from which the solvent has been removed, is subjected to photoirradiation and/or heat treatment at a higher temperatures than that in the first heat treatment. Thereby, it is possible to bake the semiconductor film in a state in which a solvent is not contained.

Preferably, the source region and drain region forming step further comprises a third heat treatment step, in which the coated film having been subjected to heat treatment is improved in crystalline quality. Thereby, for example, amorphous silicone can be made polysilicon. Also, scattering of a dopant into the backing semiconductor film is promoted. Heat treatment at high temperature for a short time is provided by, for example, laser annealing and lamp heating.

DETAILED DESCRIPTION

Embodiments of the invention will be described below with reference to the drawings. In addition, a droplet discharge method referred to in the invention is one by which a desired pattern including a discharged substance is formed by discharging droplets in a desired region and called an ink jet method in some cases. In this case, however, the discharged droplets are not a so-called ink used in printing but a liquid body containing a material substance constituting a device, the material substance containing, for example, a conductive substance constituting a device, or a substance capable of functioning as an insulating substance. Further, the discharge of droplets is not limited to spraying at the time of discharge but includes a case where the liquid body is successively discharged droplet by droplet.

Figure 1:
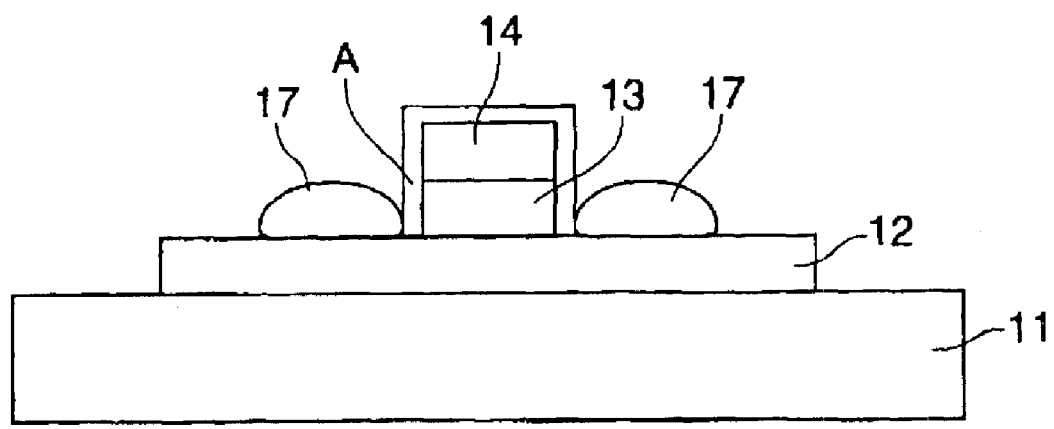
FIG. 1 is a view illustrating an example of a device (TFT) according to the invention.
Figure 14:
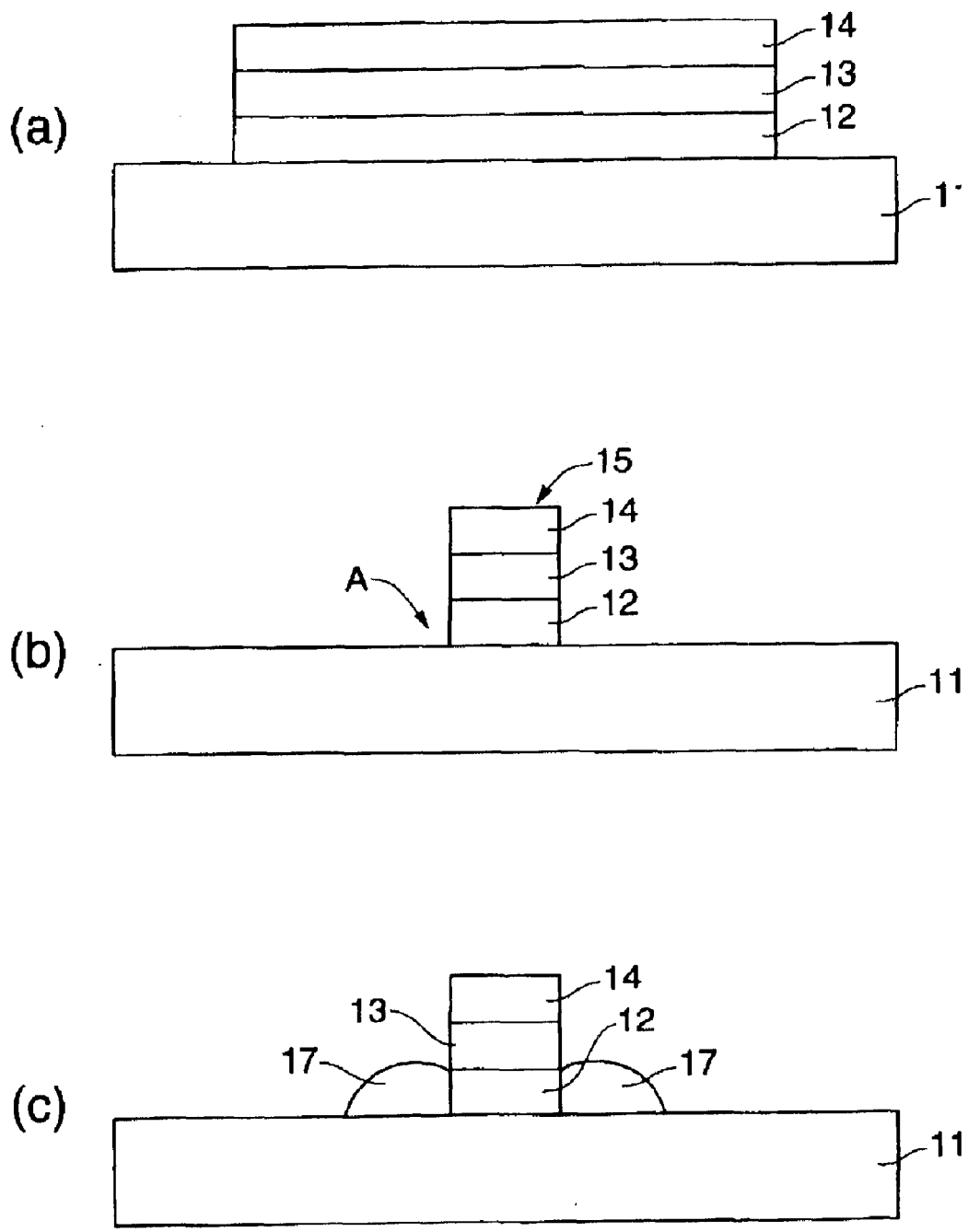
FIGS. 14a–14c are process drawings illustrating an example of manufacturing processes of a device according to a first example of a third embodiment of the invention.
Figure 21:
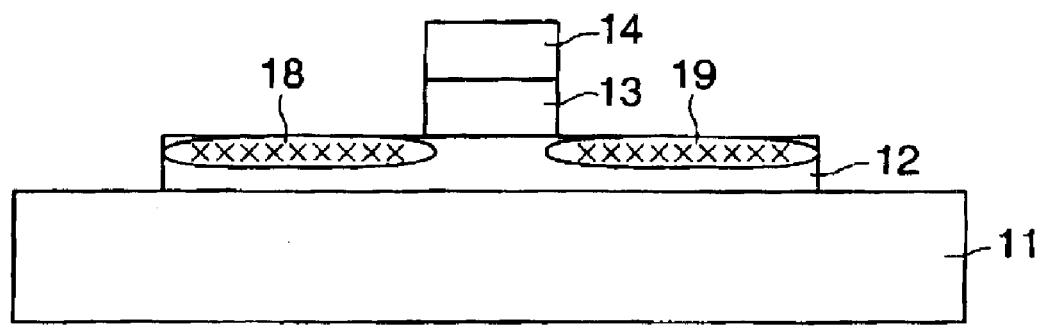
FIG. 21 is a view illustrating manufacture of a thin-film transistor with the ion implantation method of a comparative example.

First, a thin-film transistor generally used comprises, as shown in FIG. 21, an insulating substrate 11, a semiconductor film 12, a gate insulating film 13, and a gate electrode film 14, and is formed by implanting dopant ions in a source region 18 and a drain region 19 with the gate electrode film 14 as a mask and performing heat treatment. In the invention, formation of the source region 18 and the drain region 19 with the use of a liquid semiconductor material containing a dopant source is proposed instead of formation of the source region 18 and the drain region 19 by means of ion implantation. It has been found that the deposition characteristics of a semiconductor film, which can be put to practical use, is obtained by using a solution, which contains a silane compound, or a silane of higher order and a dopant source, as a liquid semiconductor material. Particularly, a silane composition of higher order is obtained by irradiating ultraviolet rays on a solution of silane compound to cause photopolymerization, adding thereto a dopant source containing a substance containing an element of group IIIB of the periodic table, or an element of group VB, or adding to a solution of silane compound a dopant source containing a substance containing an element of group IIIB of the periodic table, or an element of group VB, and then irradiating ultraviolet rays thereon to cause photopolymerization. After the liquid semiconductor material is coated on a substrate, a solvent is removed and at least one of heat treatment or phototreatment is performed to form a dope silicone film. When the liquid semiconductor material is coated on both sides of the gate region, isolation means A intervenes to prevent direct contact between the liquid semiconductor material 17 and the gate electrode film 14 as shown in FIGS. 1 and 14(b).

First Embodiment

In a first embodiment, a liquid material making a highly concentrated doped semiconductor film is coated around the gate electrode by means of the droplet discharge method, and heat treatment or phototreatment is used to form the source region and the drain region. At this time, a liquid repellent film is formed around the gate electrode to prevent the liquid material from contacting with the gate electrode whereby short-circuit between the gate electrode and the source region or the drain region is prevented.

First Example of the First Embodiment

Figure 2:
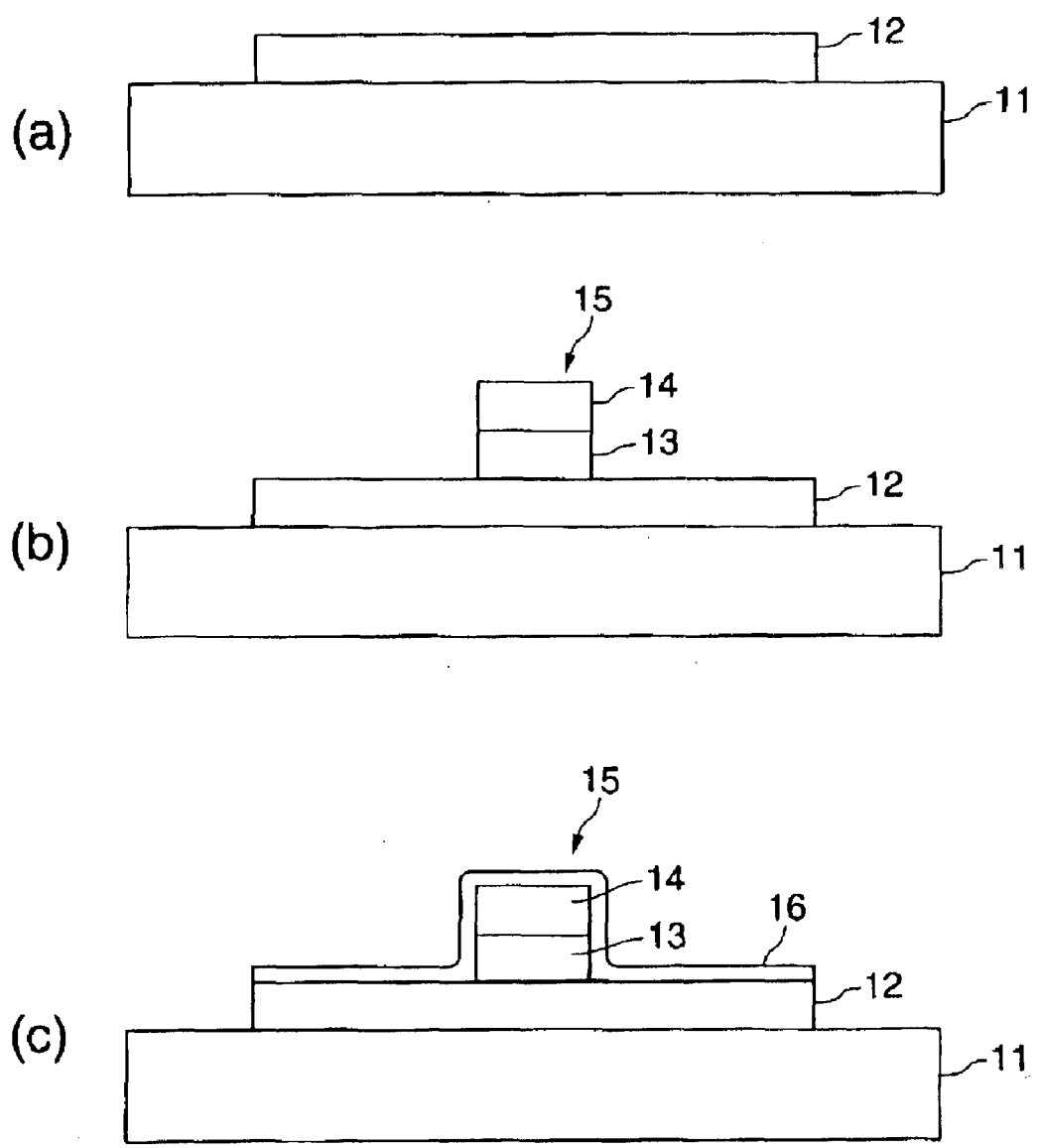
FIGS. 2a–2c are process drawings illustrating an example of manufacturing processes of a device according to a first example of a first embodiment of the invention.

First, the CVD method is used to deposit a semiconductor material such as silicone, or the like on the insulating substrate 11 such as quartz glass, or the like to form a semiconductor film 12 as shown in FIG. 2(a). Further, laser annealing is applied on the semiconductor film 12 to make a polycrystal semiconductor film (polysilicon film). The semiconductor film 12 is patterned to form an element formation region. In addition, the semiconductor film 12 may be obtained by using the spin coating or the droplet discharge method to coat a liquid material containing a semiconductor material such as silane compound or the like, and applying heat treatment to form an amorphous silicone film.

Subsequently, a gate insulating film 13 is formed on the semiconductor film 12. The gate insulating film 13 can be obtained by, for example, forming a silicone oxide film made of TEOS or the like by means of the CVD method. In addition, a silicone oxide film can be obtained by using the spin coating or the droplet discharge method to coat a solution of polyperhydrosilazane (referred below to as "polysilazane") and applying heat treatment thereon in an oxygen atmosphere.

A gate electrode film 14 is formed on the gate insulating film 13. The gate electrode film 14 can be formed by using the sputtering method to deposit a metal, for example, aluminum. Also, the gate electrode film 14 may be formed by using the droplet discharge method to coat a liquid material containing fine conductive grains of silver, gold, copper, or the like on the gate insulating film 13 and applying heat treatment thereon. The gate insulating film 13 and the gate electrode film 14 are patterned by means of a mask of gate electrode/wiring (not shown) to form a gate region 15 on the semiconductor film 12 as shown in FIG. 2(b).

Subsequently, a liquid repellent film 16 is coated on the semiconductor film 12 and sides and top of the gate region 15 as shown in FIG. 2(c). The liquid repellent film 16 adopts one having a photo peel quality. Usable as the photo peel liquid repellent film is a film, in which fluoroalkyl silane (FAS) typified by, for example, heptadeca fluoro-1,1,2, 2tetrahydrodeciletriethoxysilane, tridecafluoro-1,1,2, 2tetrahydrooctyltriethoxysilane, or the like, is subjected to heat treatment together with a substrate to thereby be arranged on the substrate.

Figure 3:
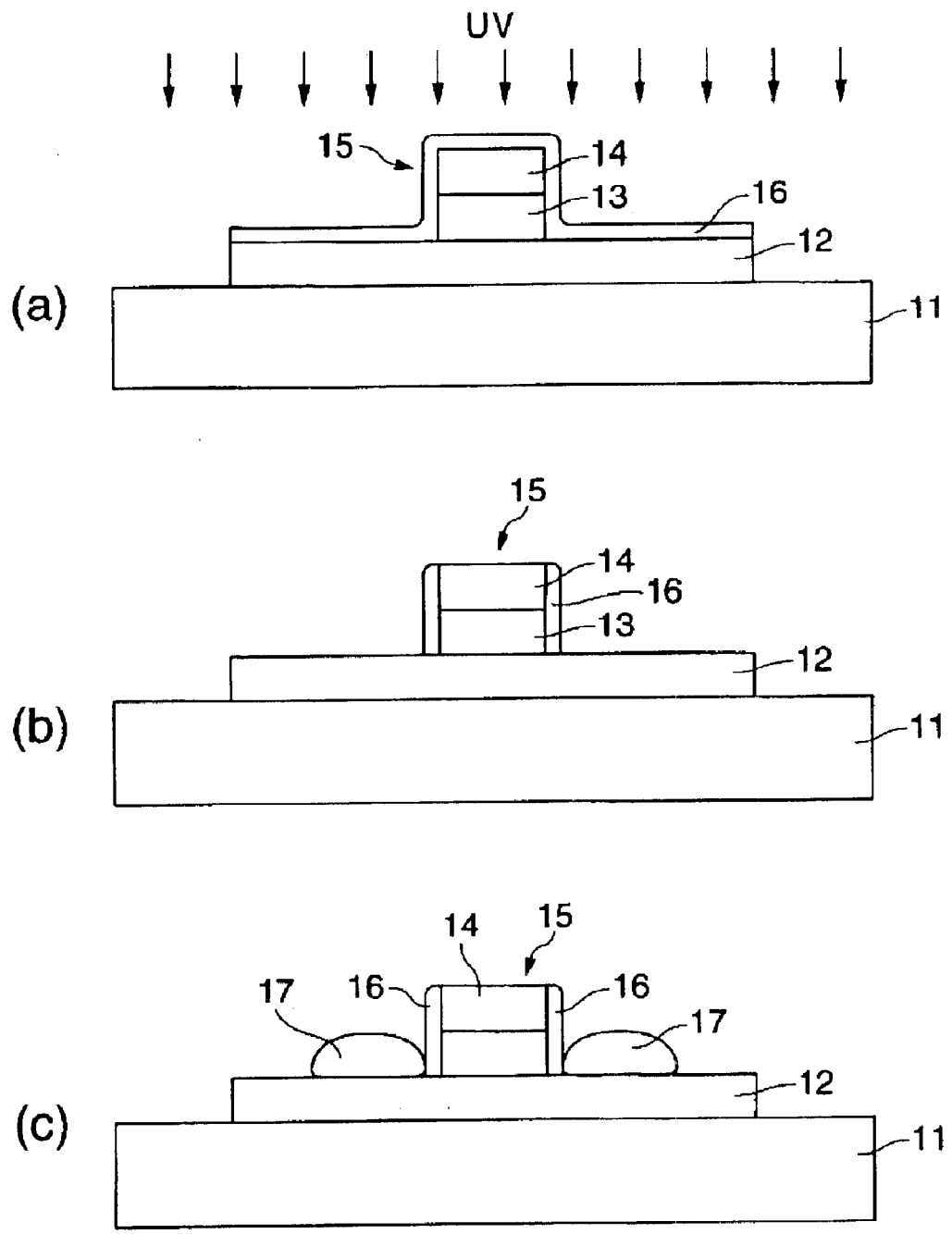
FIGS. 3a–3c are process drawings illustrating an example of manufacturing processes of the device according to the first example of the first embodiment of the invention.

Thereafter, ultraviolet rays (UV) are irradiated on the whole surface of the substrate from above the insulating substrate 11 as shown in FIG. 3(a). For example, the liquid repellent film 16 of FAS is peeled off with irradiation of ultraviolet rays having a wavelength of 172 nm but ultraviolet rays impinge on the liquid repellent film 16 present on the side wall portions of the gate region 15 is small, so that the film remains on the side wall portions. In this way, a periphery of the gate region 15 is made repellent.

The method is efficient since coating and exposure of the photo peel liquid repellent material enable accurately forming the liquid repellent film 16 on the side (side wall) of the gate electrode film 14 without the use of any photomask.

Subsequently, a source region 18 and a drain region 19 described later are formed by using the droplet discharge method to coat a liquid material 17 containing a dopant source of high concentration and a semiconductor material on both sides of the gate region 15 and applying heat treatment thereon. When the liquid material 17 is coated, the liquid repellent film 16 repels droplets from the gate electrode film 14 to prevent electric contact.

It is preferable to use, as the liquid semiconductor material 17, a material, which is obtained by adding to a cyclic silane compound a dopant source containing phosphorus and boron, irradiating ultraviolet rays thereon to cause photopolymerization to make the same a silane of higher order, and bonding the same with a dopant on a molecular level. For example, it is possible to use a solution obtained by irradiating ultraviolet rays of 254 nm on a toluene solution containing cyclotetrasilane of 20 wt. % and yellow phosphorus of 0.1 wt. %. Other examples of the liquid semiconductor material 17 containing a dopant source will be described later, and the material is appropriately selected.

Figure 4:
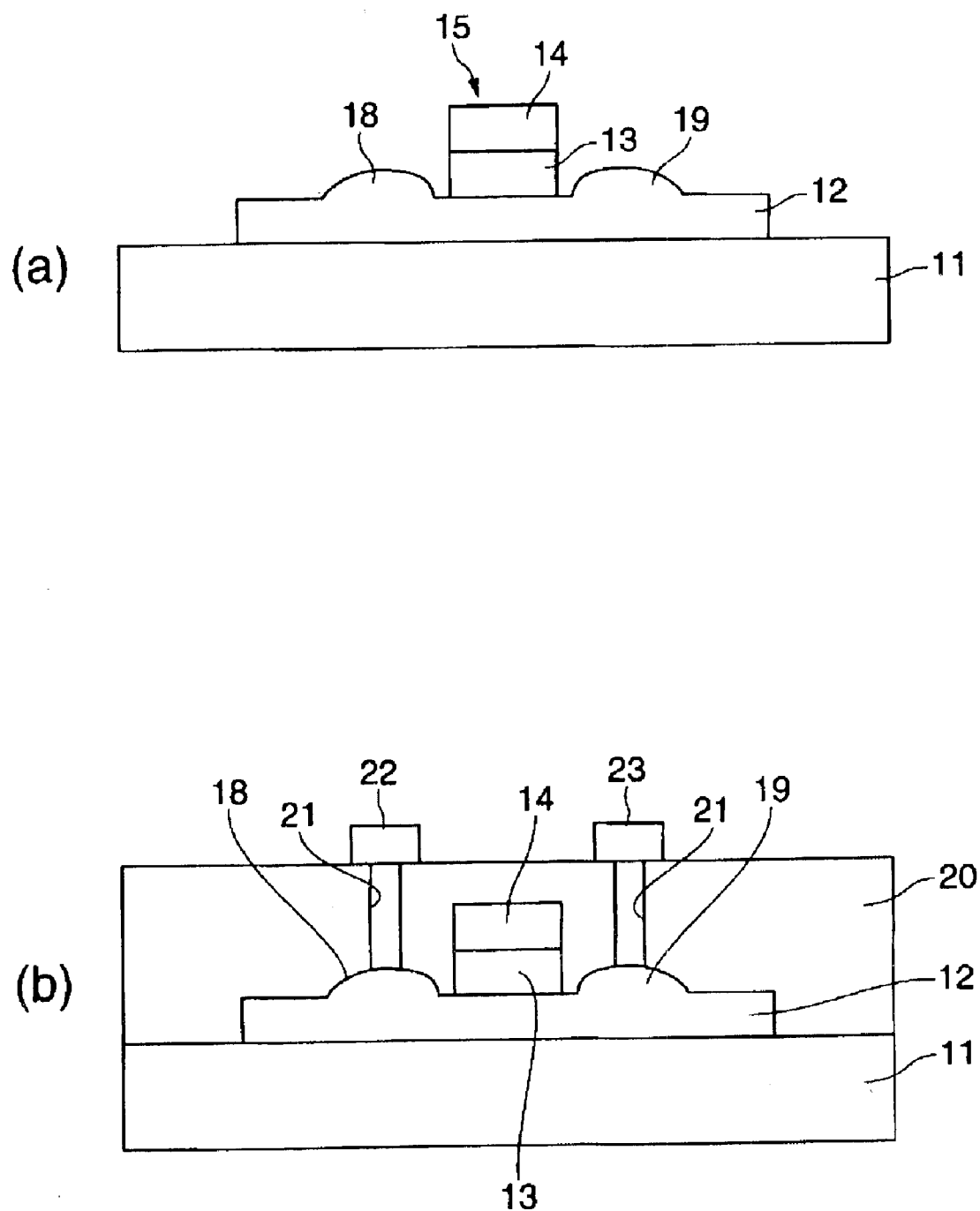
FIGS. 4a and 4b are process drawings illustrating an example of manufacturing processes of the device according to the first example of the first embodiment of the invention.

Subsequently, a coated film of the liquid semiconductor material 17 is heated to remove a solvent (first heat treatment), and heat treatment is further applied to form a source region 18 and a drain region 19, which are doped at high concentration (second heat treatment), as shown in FIG. 4(a). While heat treatment can be performed at, for example, 250 to 550° C., the characteristics are improved at 350° C. or higher. At this time, the characteristics of the semiconductor film can be improved by irradiation of ultraviolet rays having a wavelength of, for example, 172 nm before heat treatment in addition to heat treatment. Further, the film quality of the semiconductor film can be improved by performing heat treatment (third heat treatment) at high temperature for a short time with laser annealing. For example, it is possible to make an amorphous silicone film into a polysilicon film. Also, a dopant can be scattered into the semiconductor film 12. In addition, addition of a dopant can be further efficiently made by irradiation of ultraviolet rays prior to heat treatment after coating is made by means of the droplet discharge method.

When the liquid semiconductor material 17 is subjected to solidification or heat treatment, the liquid repellent film 16 evaporates to disappear and a minute gap is produced between the gate electrode film 14, and the source region 18 and the drain region 19.

As shown in FIG. 4(b), an interlaminar (interlayer) insulating film 20 is formed on the insulating substrate 11, the semiconductor film 12, the gate region 15, the source region 18 and the drain region 19. The CVD method can be used to deposit a silicone oxide film to form the interlaminar insulating film 20. Also, the silicone oxide film may be obtained from a liquid material by using the spin coating or the droplet discharge method to coat a solution of polysilazane and applying heat treatment thereon in an oxygen atmosphere.

Anisotropic etching is used to form contact holes 21, 21 in the source region 18 and the drain region 19 of the interlaminar insulating film 20. A source electrode 22 and a drain electrode 23 are formed by using the sputtering method to deposit an electrode material such as aluminum or the like in the holes and patterning the same. In addition, the source electrode 22 and the drain electrode 23 can be also formed by the use of a liquid metal material.

In this manner, the source region 18 and the drain region 19 can be formed without the use of the ion implantation method and hence a large-scale ion implantation apparatus.

Second Example of the First Embodiment

Figure 5:
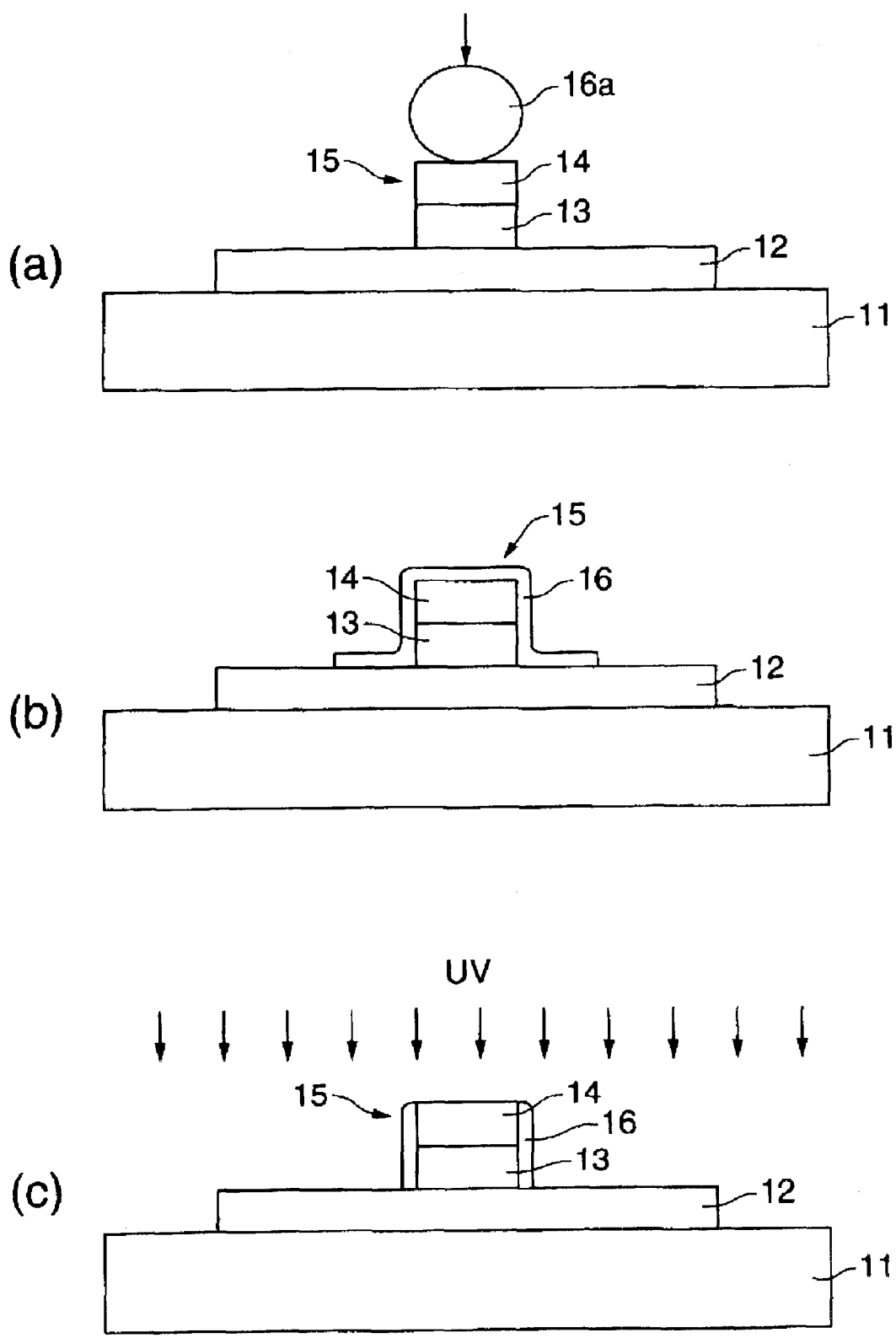
FIGS. 5a–5c are process drawings illustrating an example of manufacturing processes of a device according to a second example of the first embodiment of the invention.

FIG. 5(a) shows a second example of the first embodiment of the invention. A liquid repellent film 16 is formed around the gate region 15 by using the droplet discharge method to coat a liquid repellent material containing solution 16a on a portion about the gate region 15 in a state, in which the gate region 15 is formed as shown in FIG. 2(b). For example, a solution obtained by dissolving tridecafluoro-1,1,2,2tetrahydrooctyltriethoxysilane of 0.1 wt. % into dodecylbenzene was used as the liquid repellent material containing solution 16a to be coated from just above the gate region 15 on the substrate by means of the droplet discharge method. A pattern of the liquid repellent film 16 covering the portion about the gate region 15 was obtained by keeping the substrate at 100° C. and applying a vacuum to dry the solvent.

Thereafter, as shown in FIG. 5(c), the whole substrate was exposed to ultraviolet rays to leave the liquid repellent film 16 on a side wall around the gate region. Thus, a thin-film transistor was formed in the same steps as those shown in FIG. 3(c) and the following figures.

Another example of the liquid semiconductor material 17 formed with the source region 18 and the drain region 19 will be described below.

Used as an example of a second liquid semiconductor material 17 was a solution obtained by using a filter of 0.5 μm to filter a silane of higher order obtained by irradiating ultraviolet rays having a wavelength of 308 nm on a toluene solution of 30 ml containing tetrasilane of 20 wt. % and decaborane of 2 wt. % for 20 minutes to cause photopolymerization. A pattern for the source region 18 and the drain region 19 was formed by using the droplet discharge method to coat the solution on a portion about the gate region 15 and irradiating ultraviolet rays having a wavelength of 172 nm for one hour.

As an example of a third liquid semiconductor material 17, a xylene solution containing cyclopentasilane of 40 wt. % and phosphine of 0.4 wt. % was used. A pattern for the source region 18 and the drain region 19 was formed by using the droplet discharge method to coat the xylene solution on a portion about the gate region 15 and thereafter irradiating ultraviolet rays having a wavelength of 254 nm for 20 minutes.

As an example of a fourth liquid semiconductor material 17, a solution obtained by filtering a solution containing a silane of higher order obtained by irradiating ultraviolet rays having a wavelength of 254 nm on a xylene solution of 40 ml containing pentasilane of 40 wt. % and tetraborane of 4 wt. % for 15 minutes to cause photopolymerization can be used. A pattern for the source region 18 and the drain region 19 was formed by using the droplet discharge method to coat the solution on a portion about the gate region 15, performing heat treatment at a reduced pressure of 1 torr and at 100° C. to remove the solvent, and thereafter performing baking at 350° C. for 10 minutes. In addition, with the fourth liquid semiconductor material, a solution obtained by dissolving tridecafluoro-1,1,2,2tetrahydrooctyltriethoxysilane of 0.1 wt. % into dodecylbenzene was coated as a material of the liquid repellent film 16 on the gate region 15 by means of the droplet discharge method. The liquid repellent film 16 was formed by keeping the substrate at 40° C. and applying vacuum on and heating the same to 100° C. to dry the solvent.

As an example of a fifth liquid semiconductor material 17, a solution obtained by dissolving arsine of 1 g into a xylene solution of 40 ml containing trisilane of 40 wt. % was used. The source region 18 and the drain region 19 were formed by using the droplet discharge method to coat the solution about the gate region 15 and performing baking at 420° C. for 30 minutes after irradiation of ultraviolet rays having a wavelength of 254 nm for 30 minutes. In addition, with the fifth liquid semiconductor material, a solution obtained by dissolving tridecafluoro-1,1,2, 2tetrahydrooctyltriethoxysilane of 0.1 wt. % into dodecylbenzene was coated as a material of the liquid repellent film 16 on the gate region 15 by means of the droplet discharge method. The liquid repellent film 16 was formed by keeping the substrate at 40° C. and applying a vacuum to dry the solvent.

Third Example of the First Embodiment

Figure 6:
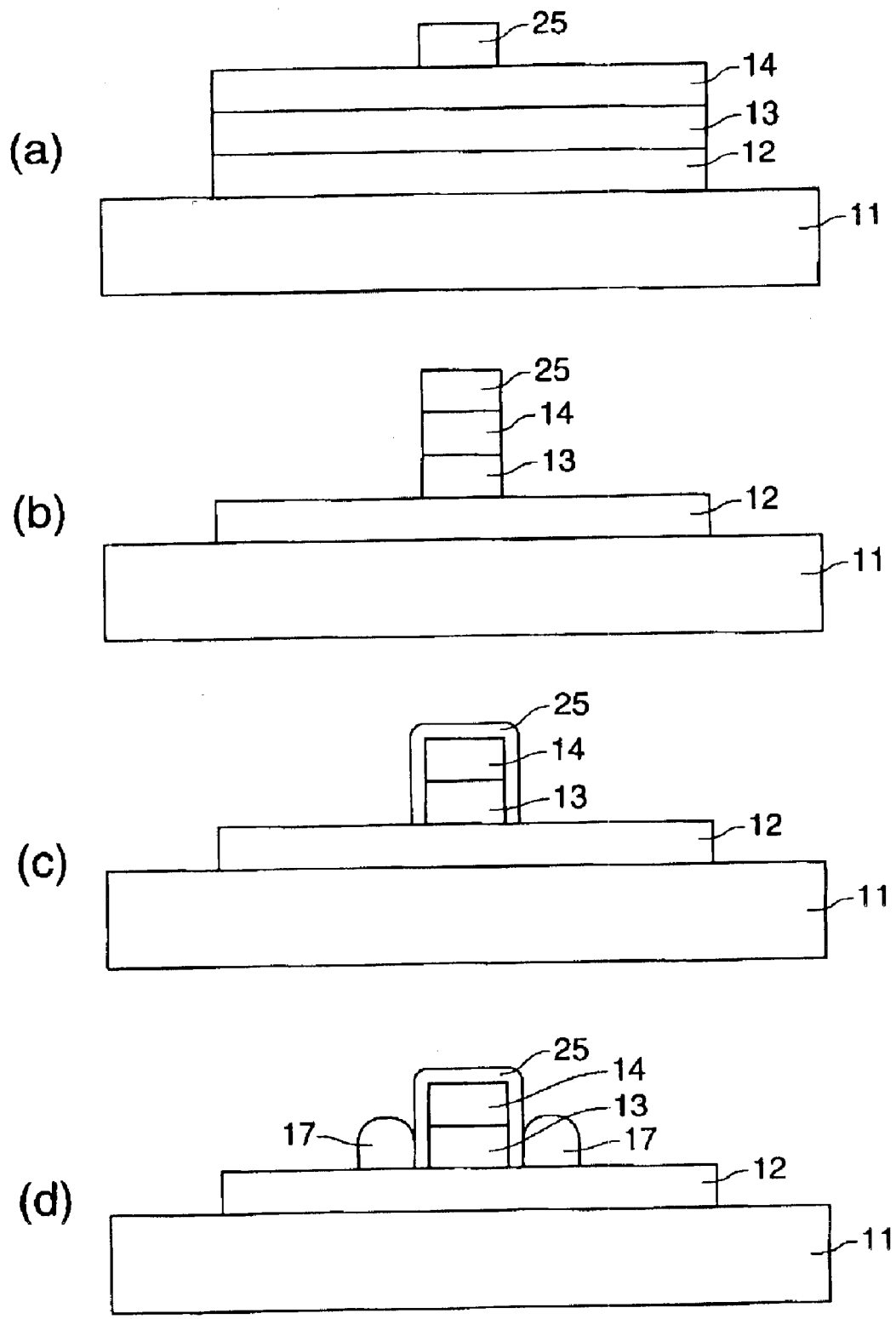
FIGS. 6a–6d are process drawings illustrating an example of manufacturing processes of a device according to a third example of the first embodiment of the invention.
Figure 7:
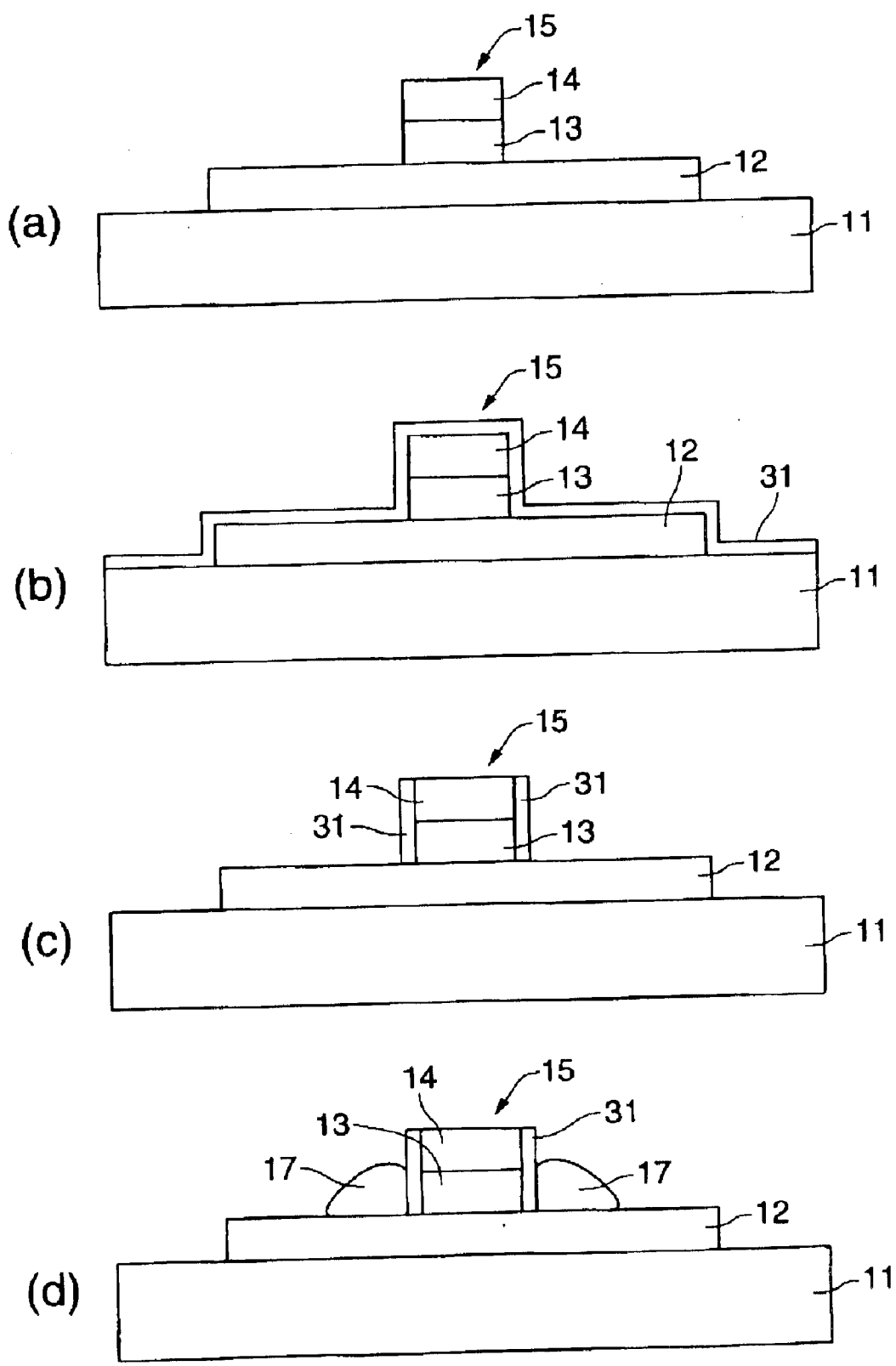
FIGS. 7a–7d are process drawings illustrating an example of manufacturing processes of a device according to a first example of a second embodiment of the invention.

FIG. 6 shows a third example of the first embodiment of the invention. As shown in FIG. 6(a), a semiconductor film 12, a gate insulating film 13 and a gate electrode film 14 were formed on an insulating substrate 11, and a known method was used to perform etching making use of a photoresist 25, so that a state shown in FIG. 6(b) came out. Thereafter, the photoresist 25 was dissolved by heating the substrate and performing an appropriate temperature control to dissolve the photoresist 25 to cover the gate electrode film 14 as shown in FIG. 6(c). Subsequently, the substrate was subjected to fluorine plasma processing to subject surfaces of the photoresist 25 to fluorine processing to provide for a repellent quality. Here, the droplet discharge method was used to coat the liquid semiconductor material 17 as shown in FIG. 6(d) to perform the heat treatment. Further, an interlaminar insulating film 20, contact hole 21, source electrode 22, and a drain electrode 23 were formed to enable making a semiconductor device, as shown in FIG. 4(b).

Second Embodiment

A second embodiment of the invention will be described below with reference to FIGS. 7 to 13. In the second embodiment, an insulating film is formed around a gate region and a liquid semiconductor material is coated around the gate region to be able to form a source region and a drain region as a configuration for preventing contact between a gate electrode film, and the source region and the drain region. Four examples of formation of an insulating film around the gate region are proposed.

First Example of the Second Embodiment

A first example of the second embodiment of the invention will be described. In the embodiment, after an insulating film is formed on a whole substrate, anisotropic etching is used to leave an insulating film on a side wall around a gate region.

First, as shown in FIG. 7(a), a semiconductor region 12, a gate insulating film 13 and a gate electrode film 14 were formed on an insulating substrate 11. This step is the same as that shown in FIGS. 2(a) and 2(b).

Subsequently, as shown in FIG. 7(b), the CVD method was used to deposit an thin insulating material on a whole substrate to form an insulating film 31. The insulating film 31 comprised, for example, a silicone oxide film and was formed to have a thickness of 250 nm.

As shown in FIG. 7(c), when anisotropic etching such as RIE or the like was applied on a whole substrate just from above, the insulating film 31 was left on respective side wall portions of the gate insulating film 13 and the gate electrode film 14, which were relatively large in film thickness in a vertical direction as viewed in the figure. The insulating film 31 can be formed to have a very small film thickness in directions toward a source/drain regions.

In addition, the insulating film 31 may be formed by using the spin coating or the droplet discharge method to coat a solution of polysilazane on a whole substrate and applying heat treatment thereon in an oxygen atmosphere to form a silicone oxide film.

Subsequently, as shown in FIG. 7(d), the droplet discharge method was used to coat a liquid semiconductor material 17 containing a silane of higher order and a dopant source on both sides of a gate region 15 of a semiconductor film 12. The liquid semiconductor material 17 comprised, for example, a toluene solution containing silyltetrasilane of 20 wt. % and yellow phosphorus of 0.1 wt. %. A source region 18 and a drain region 19 were formed as shown in FIG. 8(a) by baking the liquid semiconductor material 17 coated on the substrate at 400° C. for 20 minutes and then irradiating excimer laser having a wavelength of 308 nm at energy density of 360 mJ/cm$^2$ to make a dope polycrystal silicone film.

Further, as shown in FIG. 8(b), an interlaminar insulating film 20 was formed on the substrate 11, the semiconductor film 12, the gate region 15, the source region 18, and the drain region 19. The CVD method was used to deposit a silicone oxide film to be able to form the interlaminar insulating film 20. Also, a silicone oxide film may be obtained from a liquid material by using the spin coating or the droplet discharge method to coat a solution of polysilazane and applying heat treatment thereon in an oxygen atmosphere.

Anisotropic etching was used to form contact holes 21, 21 in the source region 18 and the drain region 19 of the interlaminar insulating film 20. A source electrode 22 and a drain electrode 23 were formed by using the sputtering method to deposit an electrode material such as aluminum or the like in the holes and patterning the same. In addition, the source electrode 22 and the drain electrode 23 can be also formed by the use of a liquid metal material.

In this manner, the source region 18 and the drain region 19 can be formed without the use of ion implantation method and hence a large-scale ion implantation apparatus.

Second Example of the Second Embodiment

A second example of the second embodiment of the invention will be described. In the second example, after a gate electrode film was patterned, an insulating film was formed on a whole substrate, and anisotropic etching was used to leave the insulating film only on a side wall around the gate region.

First, as shown in FIG. 9(a), a semiconductor region 12, a gate insulating film 13 and a gate electrode film 14 were formed on an insulating substrate 11 by means of the known method, and only the gate electrode film 14 could be formed by means of a photoetching method (not shown).

Subsequently, as shown in FIG. 9(b), the CVD method was used to deposit an insulating material thin on a whole substrate to form an insulating film 31. The insulating film 31 comprised, for example, a silicone oxide film and was formed to have a thickness of 2000 Å.

As shown in FIG. 9(c), anisotropic etching such as RIE or the like was applied on the insulating film 31 and the insulating film 13 from just above. In this step, the gate insulating film 13 having a relatively large film thickness in a vertical direction as viewed in the figure and the insulating film 31 on respective side wall portions of the gate electrode film 14 were left. The insulating film 31 can be formed to have a very small film thickness in directions toward a source/drain regions.

In addition, the insulating film 31 may be formed by using the spin coating or the droplet discharge method to coat a solution of polysilazane on a whole substrate and applying heat treatment thereon in an oxygen atmosphere to form a silicone oxide film.

Subsequently, as shown in FIG. 9(d), the droplet discharge method was used to coat a liquid semiconductor material 17 containing a silane of higher order and a dopant source on both sides of a gate region 15 of a semiconductor film 12. The liquid semiconductor material 17 comprised, for example, a toluene solution containing silyltetrasilane of 20 wt. % and yellow phosphorus of 0.1 wt. %. A source region 18 and a drain region 19 were formed in the same manner as in FIG. 8(a) by baking the liquid semiconductor material 17 coated on the substrate at 400° C. for 20 minutes and then irradiating excimer laser having a wavelength of 308 nm at energy density of 360 mJ/cm² to make a doped polycrystal silicone film.

Further, in the same manner as in FIG. 8(b), an interlaminar insulating film 20 was formed on the insulating substrate 11, the semiconductor film 12, the gate region 15, the source region 18, and the drain region 19. The CVD method was used to deposit a silicone oxide film to be able to form the interlaminar insulating film 20. Also, a silicone oxide film may be obtained from a liquid material by using the spin coating or the droplet discharge method to coat a solution of polysilazane and applying heat treatment thereon in an oxygen atmosphere.

Anisotropic etching was used to form contact holes 21, 21 in the source region 18 and the drain region 19 of the interlaminar insulating film 20. A source electrode 22 and a drain electrode 23 were formed by using the sputtering method to deposit an electrode material such as aluminum or the like in the holes and patterning the same. In addition, the source electrode 22 and the drain electrode 23 can be also formed by the use of a liquid metal material.

In this manner, the source region 18 and the drain region 19 can be formed without the use of ion implantation method and hence a large-scale ion implantation apparatus.

Third Example of the Second Embodiment

Figure 10:
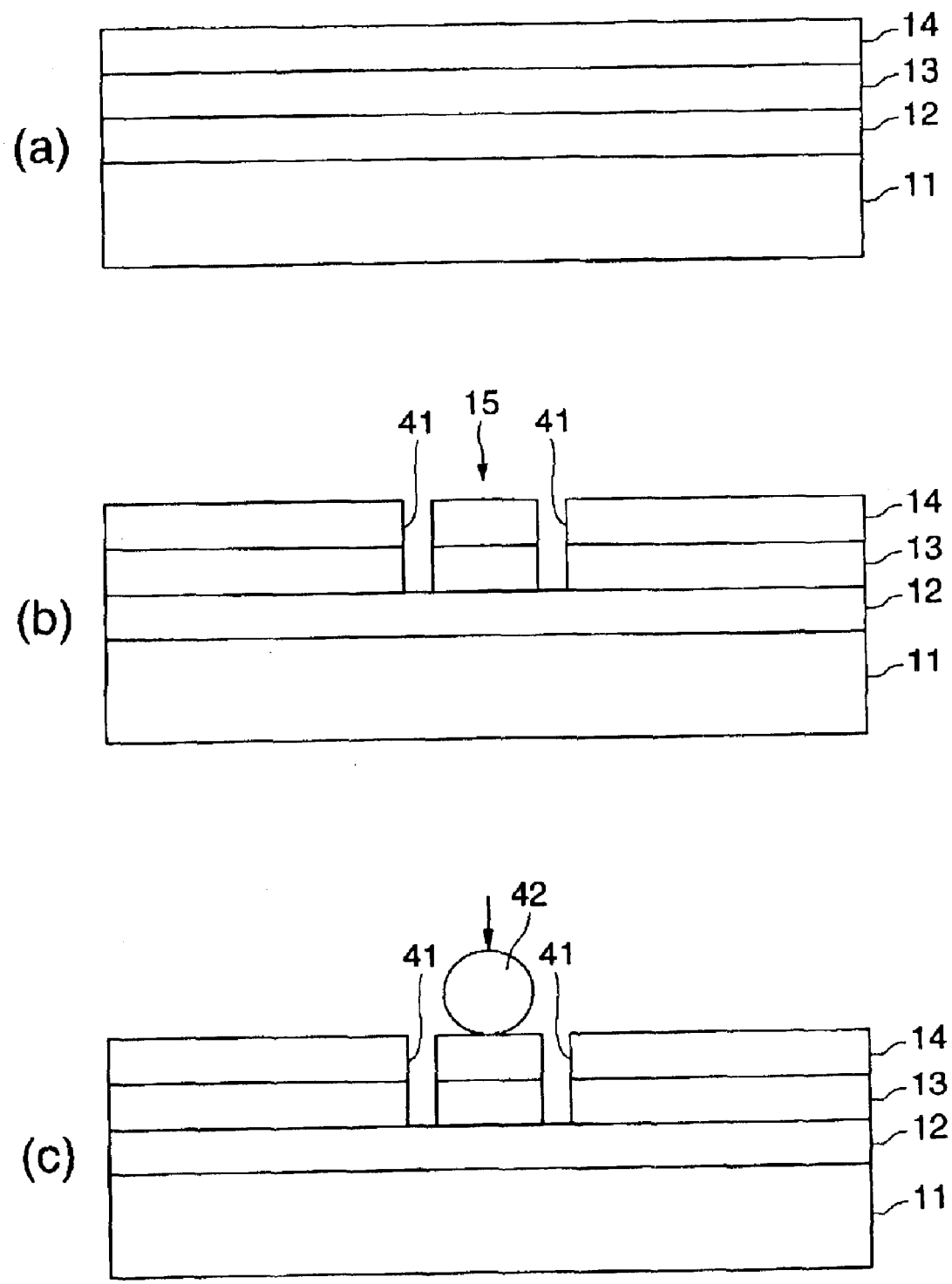
FIGS. 10a–10c are process drawings illustrating an example of manufacturing processes of a device according to a third example of the second embodiment of the invention.
Figure 11:
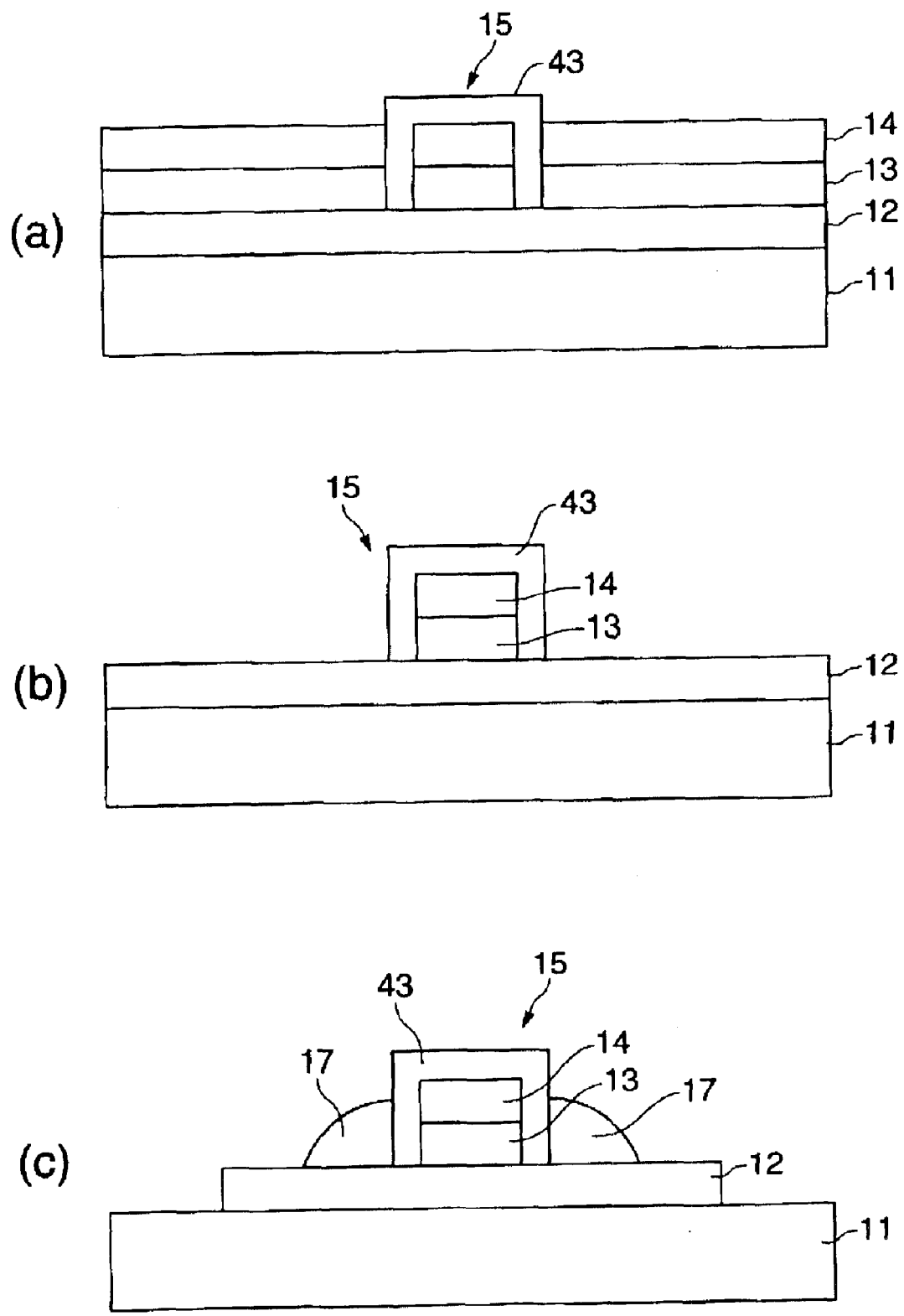
FIGS. 11a–11c are process drawings illustrating an example of manufacturing processes of the device according to the third example of the second embodiment of the invention.

A third example of the second embodiment of the invention will be described with reference to FIGS. 10 and 11. In the embodiment, an insulating film is formed around a gate region by performing etching around the gate region to form a hole and filling up the hole with the insulating film.

First, the CVD method was used to form a semiconductor film 12 on an insulating substrate 11 as shown in FIG. 10(a). The semiconductor film 12 comprised, for example, an amorphous silicone film. In addition, laser annealing may be applied to make a polysilicon film. The CVD method was used to form a gate insulating film 13 on the semiconductor film 12. The gate insulating film 13 comprised, for example, a silicone oxide film. In addition, the spin coating or the like may be used to coat a solution containing polysilazane and to bake the silicone oxide film. The sputtering method was used to form a gate electrode film 14 on the gate insulating film 13. The gate electrode film 14 was made of, for example, aluminum. In addition, the spin coating or the like may be used to coat a liquid material containing metal to bake the same to form a metallic gate electrode film.

Subsequently, as shown in FIG. 10(b), an etching mask was obtained by coating a photoresist (not shown), performing exposure by means of a mask pattern surrounding a gate region, and performing development, and grooves 41 extending to the semiconductor film 12 were formed around the gate region 15 by means of a known wet etching and a dry etching such as RIE or the like.

As shown in FIG. 10(c), the droplet discharge method was used to coat a liquid insulating material 42 about the gate region 15 to fill up the grooves 41. At this time, a liquid repellent film (see FIG. 3) was made use of to enable correctly introducing the liquid insulating material 42 into the grooves 41. For example, prior to coating of the liquid insulating material 42, a liquid repellent material such as FAS was deposited on a whole substrate at the processing temperature of 120° C., and a photomask was used to remove only the liquid repellent film in the gate region. Thereby, the liquid insulating material 42 could be coated only on the gate region 15.

As shown in FIG. 11(a), the liquid insulating material 42 filled up into the grooves 41 was baked to form an insulating film 43. As described above, for example, a xylene solution containing polysilazane of 2 wt. % could be used as the liquid insulating material 42. A silicone oxide film could be obtained by heating the solution at 100° C. for 15 minutes to remove a solvent, and performing baking at 300° C. for 20 minutes in an oxygen atmosphere.

Further, an etching mask was formed by performing coating of a photoresist (not shown), exposure and development, portions except the gate region 15 were exposed, and anisotropic etching was performed to remove a gate insulating film 13 and a gate electrode film 14 except the gate region 15.

Thereby, the gate region 15 surrounded by the insulating film 43 was formed on the semiconductor film 12 as shown in FIG. 11(b).

As shown in FIG. 11(c), the droplet discharge method was used to coat a liquid semiconductor material 17 containing a silane of higher order and a dopant source on both sides of the gate region 15 with the use of the gate region 15 as a wall. The liquid semiconductor material 17 comprised, for example, a toluene solution containing tetrasilane of 20 wt. % and yellow phosphorus of 0.1 wt. %. A source region 18 and a drain region 19 (see FIG. 8(a)) were formed by irradiating ultraviolet rays having a wavelength of 308 nm on the coated liquid semiconductor material 17 for 30 minutes, then removing a solvent, and performing heating at 350° C. for 5 minutes to bake the coated film.

Thereafter, a source electrode and a drain electrode were formed in the same step as that shown in FIG. 8(b) to form a thin-film transistor.

In this manner, with the third example, the insulating film 43 was formed thin around the gate electrode film 14 whereby contact between the gate electrode film 14 and the liquid semiconductor material 17 could be avoided.

Fourth Example of the Second Embodiment

Figure 12:
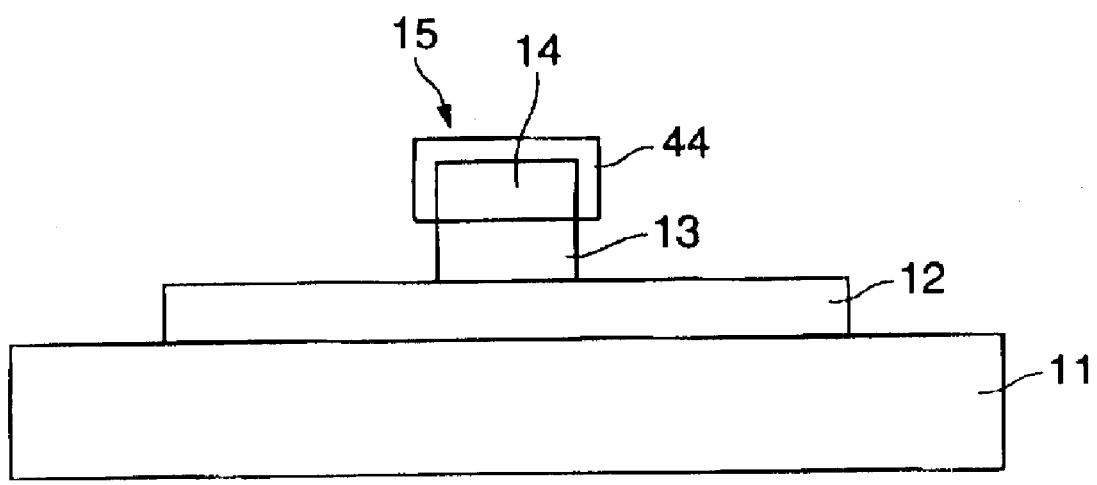
FIG. 12 is a process drawing illustrating an example of manufacturing processes of a device according to a fourth example of the second embodiment of the invention.
Figure 13:
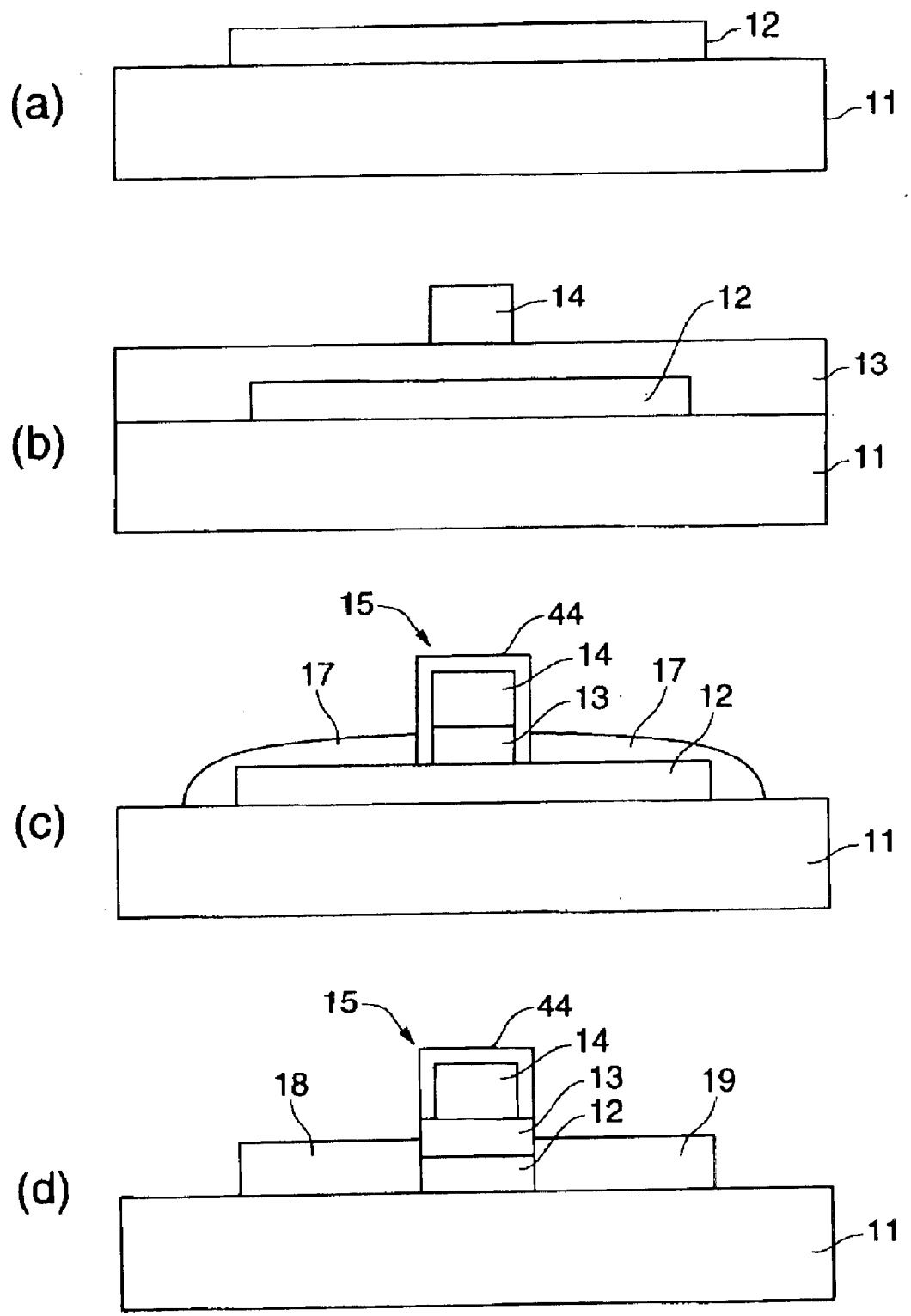
FIGS. 13a–13d are process drawings illustrating an example of manufacturing processes of the device according to the fourth example of the second embodiment of the invention.

A fourth example of the second embodiment of the invention will be described with reference to FIGS. 12 and 13.

In the example, a gate electrode film 14 was made of aluminum and subjected to anodizing to form an oxide film $Al_2O_3$ on an aluminum surface. The oxide film comprised an insulating film. Thereby, an insulating film 44 was formed around the gate electrode film 14 to be able to eliminate contact between the gate electrode film 14 and a liquid semiconductor material. Since aluminum is generally used for a gate electrode film, it is easily applied, and an oxide film produced by anodizing can be accurately formed to have a thickness. Thallium as well as aluminum can be used as the gate electrode film 14.

First, as shown in FIG. 13(a), the CVD method was used to form a semiconductor film 12 on an insulating substrate 11 such as quartz glass, or the like. The semiconductor film was patterned corresponding to element formation regions. While the semiconductor film 12 comprised, for example, an amorphous silicone film, laser annealing may be applied to make a polysilicon film. Further, the CVD method was used to deposit an insulating film on the substrate 11 and the semiconductor film 12 to form a gate insulating film 13. The gate insulating film 13 comprised, for example, a silicone oxide film.

As shown in FIG. 13(b), the sputtering method was used to deposit aluminum on the gate insulating film 13, and the deposited aluminum was patterned to form a gate electrode film 14.

A citric acid aqueous solution was used to pass electricity through the gate electrode film 14 under conditions of current density of 0.1 $mA/cm^2$ and voltage of 30 V to oxidize external surfaces of aluminum. In this way, anodizing was applied on the gate electrode film 14 to form an insulating film 44 on an outer periphery thereof. Further, the gate insulating film 13 was removed by performing anisotropic etching from above with the gate electrode film 14 as a mask.

Subsequently, as shown in FIG. 13(c), a liquid semiconductor material 17 containing a silane of higher order and a dopant source was coated on both sides of the gate region 15 composed of the gate insulating film 13, the gate electrode film 14, and the insulating film 44. Materials described above can be appropriately selected and used for the liquid semiconductor material 17 and ones specifically suited to the processing may be prepared.

As shown in FIG. 13(d), a source region 18 and a drain region 19 were formed by heating the coated film of the liquid semiconductor material 17 to remove a solvent, and further subjecting the coated film to heat treatment to scatter a dopant in the semiconductor film 12.

Thereafter, as shown in FIG. 7(b), deposition of an interlaminar insulating film, formation of contact holes, and formation of source/drain electrodes were performed to form a thin-film transistor.

Third Embodiment

A third embodiment of the invention will be described below with reference to FIGS. 14 to 17.

In the third embodiment, a gate electrode film 14 and a liquid semiconductor material 17 were spaced away from each other in a vertical direction as viewed in the figure in order to avoid contact between the gate electrode film 14 and the liquid semiconductor material 17.

First Example of the Third Embodiment

Therefore, in the first example, etching was performed to remove even a semiconductor film in a source region and a drain region, and a liquid semiconductor material was coated on an insulating substrate to separate a gate electrode film and the liquid semiconductor material from each other in a vertical direction, thus avoiding contact therebetween.

More specifically, as shown in FIG. 14(a), the CVD method was used to form a semiconductor film 12 and a gate insulating film 13 on the insulating substrate 11. Further, the sputtering method was used to deposit aluminum or the like on the gate insulating film 13 to form a gate electrode film 14.

As shown in FIG. 14(b), anisotropic etching was performed from above in the figure to pattern the gate electrode film 14, the gate insulating film 13, and the semiconductor film 12 to form a gate region 15. At this time, etchback was performed up to the insulating substrate 11.

As shown in FIG. 14(c), a liquid semiconductor material 17 was coated on both sides of the gate region 15 by the use of side walls of the gate region. Since the liquid semiconductor material 17 was coated from above the insulating substrate 11, it did not contact with the gate electrode film 14.

Second Example of the Third Embodiment

Figure 15:
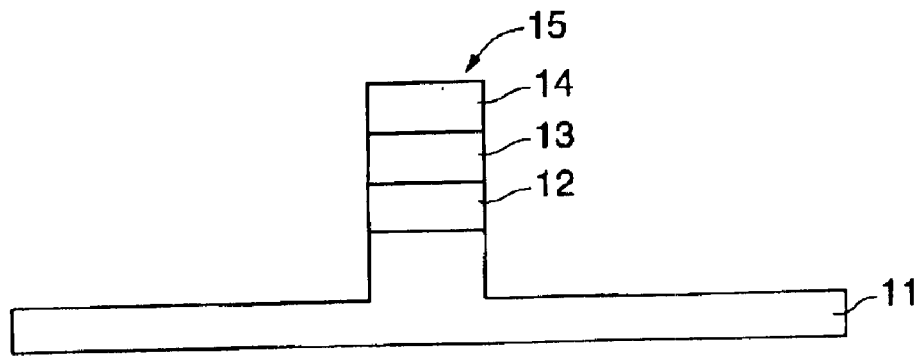
FIGS. 15a and 15b are process drawings illustrating an example of manufacturing processes of a device according to a second example of the third embodiment of the invention.
Figure 15:
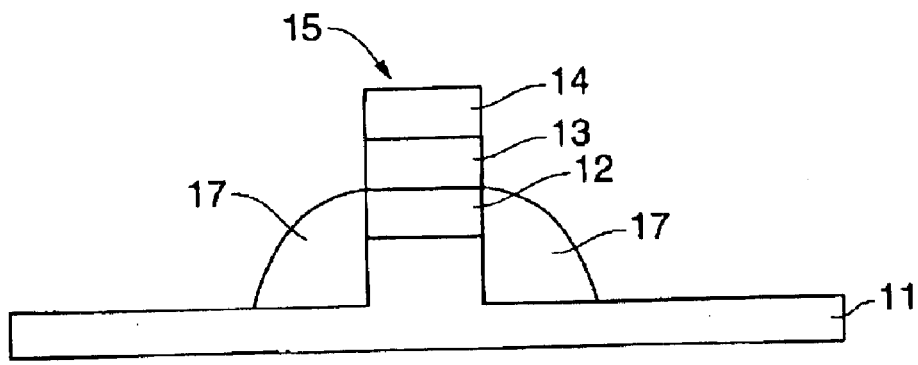

A second example of the third embodiment of the invention will be described with reference to FIG. 15.

In the second example, as shown in FIG. 15(a), a gate electrode film 14 and a liquid semiconductor material were spaced away from each other in a vertical direction as viewed in the figure in order to avoid contact between the gate electrode film 14 and the liquid semiconductor material. Therefore, even an insulating substrate 11 was subjected to etching.

As shown in FIG. 15(b), the insulating substrate 11 and a semiconductor film 12 were made use of as walls to relatively increase a height of side walls of a gate region 15, thus making it possible to coat a large amount of liquid semiconductor material 17 on both sides of the gate region 15. Thereafter, the same processings as those shown in FIG. 4 were carried out to enable forming a thin-film transistor. In addition, various materials described above can be used, as the liquid semiconductor material 17. Also, such materials can be prepared at need.

Third Example of the Third Embodiment

A third example of the third embodiment of the invention will be described with reference to FIG. 16.

In the embodiment, grooves were formed by subjecting a source region and a drain region to etching. A liquid semiconductor material containing a silane of higher order and a dopant source was filled up into the grooves to form the source region and a drain region, which have a large film thickness. Also, it is possible to prevent the discharged liquid from sticking to and remaining in the channels, thus enabling stable formation of an element.

Figure 16:
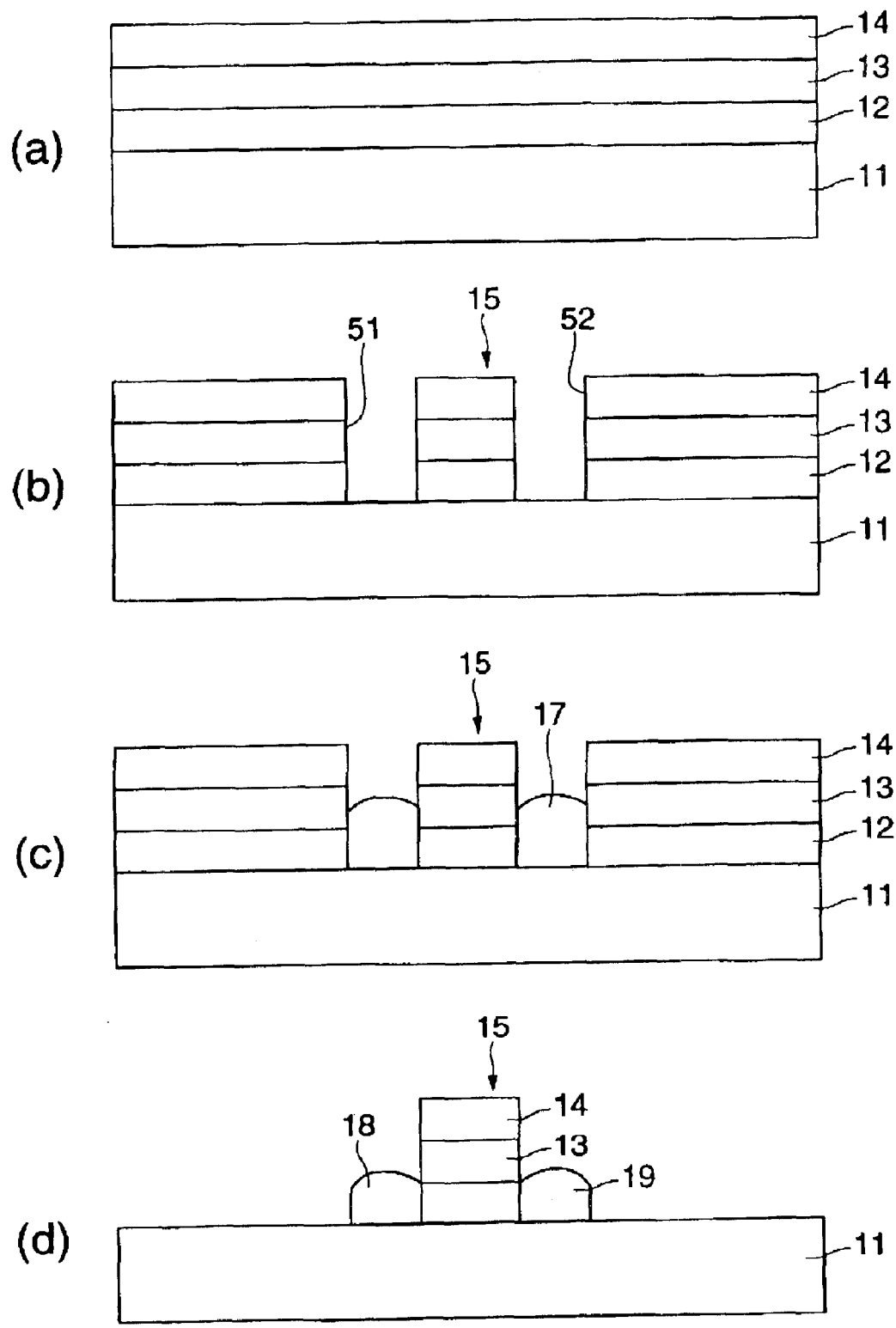
FIGS. 16a–16d are process drawings illustrating an example of manufacturing processes of a device according to a third example of the third embodiment of the invention.

As shown in FIG. 16(*a*), a semiconductor film 12, a gate insulating film 13 and a gate electrode film 14 were formed on an insulating substrate 11.

As shown in FIG. 16(*b*), the substrate 11 was patterned to form grooves 51, 52 opening the source region and the drain region.

As shown in FIG. 16(*c*), the droplet discharge method was used to discharge the liquid semiconductor material 17 into the grooves 51, 52. A xylene solution containing cyclopentasilane of 40 wt. % and yellow phosphorus of 1 wt. % was used as the liquid semiconductor material 17. After the discharge, a source region 18 and a drain region 19, which were made of a highly concentrated doped silicon film, were formed by irradiating ultraviolet rays having a wavelength of 308 nm for 5 minutes, and then baking the substrate at 350° C.

As shown in FIG. 16(*d*), etching was further performed to remove the semiconductor film 12, the gate insulating film 13 and the gate electrode film 14 except the gate region 15.

Figure 8:
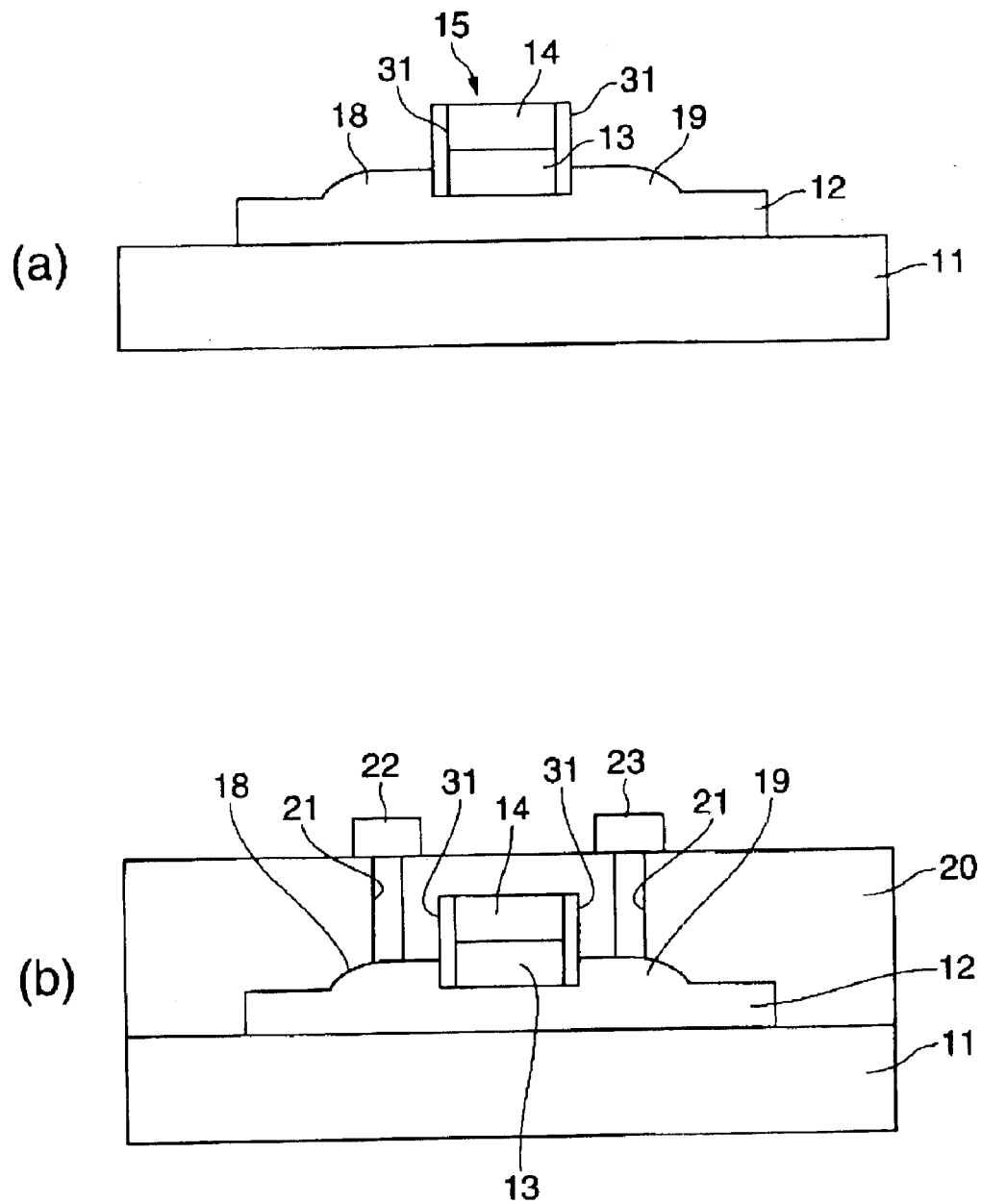
FIGS. 8a and 8b are process drawings illustrating an example of manufacturing processes of the device according to the first example of the second embodiment of the invention.
Figure 9:
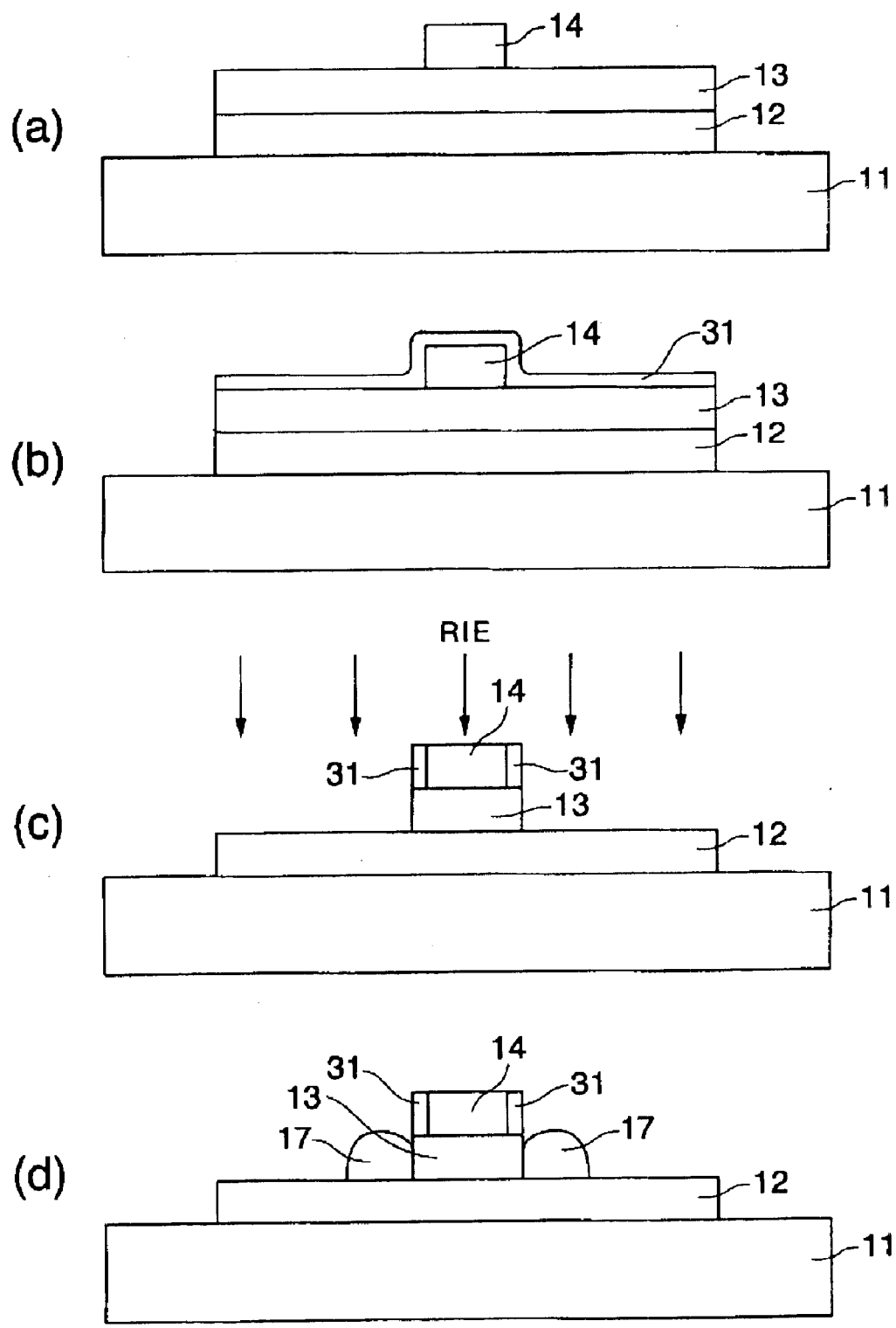
FIGS. 9a–9d are process drawings illustrating an example of manufacturing processes of a device according to a second example of the second embodiment of the invention.

Thereafter, as shown in FIG. 8(*b*), deposition of an interlaminar insulating film, formation of contact holes, and formation of source/drain electrodes were performed to form a thin-film transistor.

Fourth Example of the Third Embodiment

A fourth example of the third embodiment of the invention will be described with reference to FIG. 17.

Figure 17:
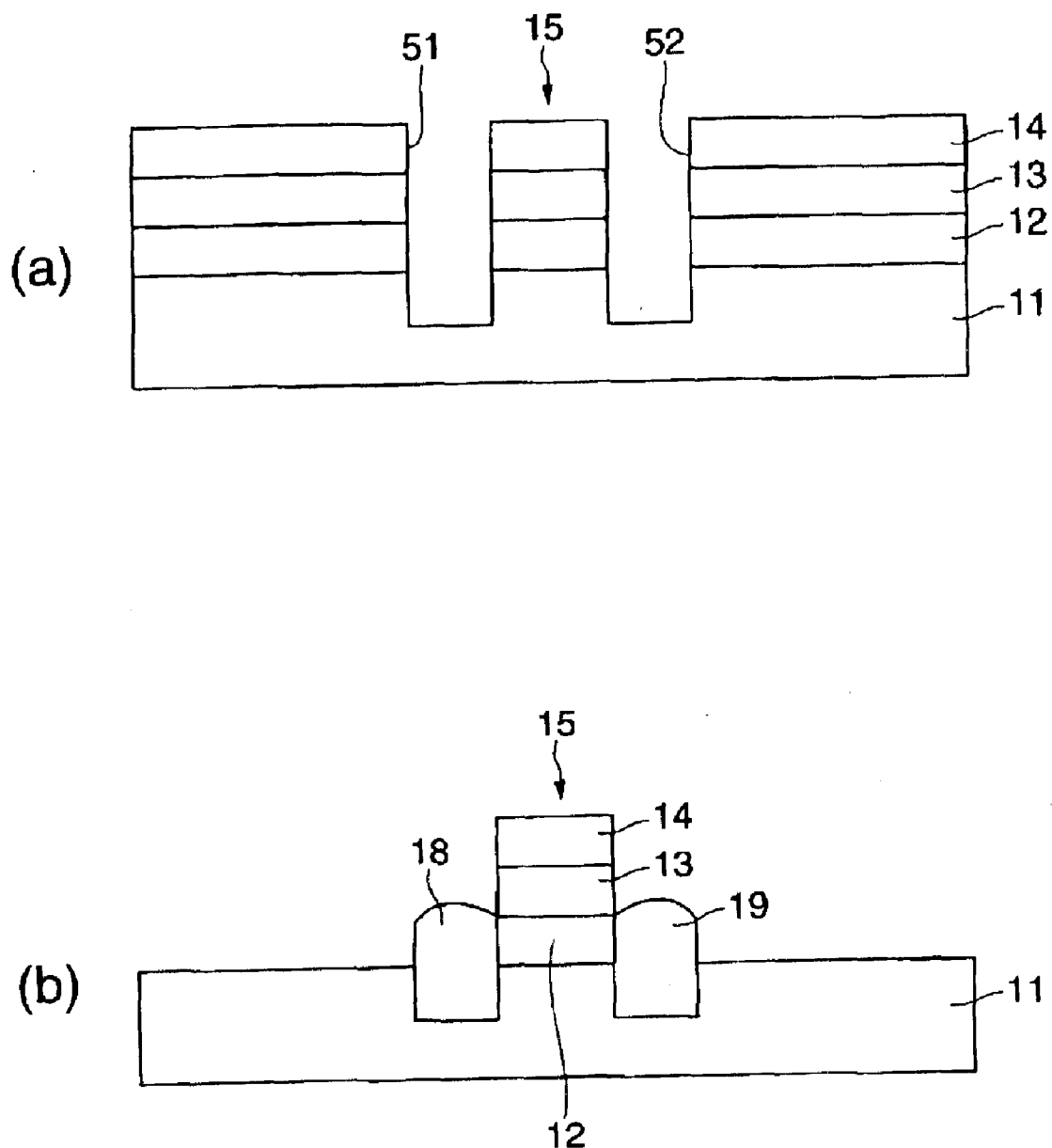
FIGS. 17a and 17b are process drawings illustrating an example of manufacturing processes of a device according to a fourth example of the third embodiment of the invention.

In the example, as shown in FIG. 17(*a*), the grooves 51, 52 (see FIG. 16(*b*)) in the third example were formed deeper by subjecting even an insulating substrate 11 to etching.

And in the same manner as in the above embodiment, the droplet discharge method was used to discharge a large amount of the liquid semiconductor material 17 into the grooves 51, 52. That doped semiconductor film in the source region 18 and the drain region 19, which was accurately controlled in structure, was obtained as shown in FIG. 17(*b*) by heating the coated film to remove a solvent and further baking the same.

Figure 18:
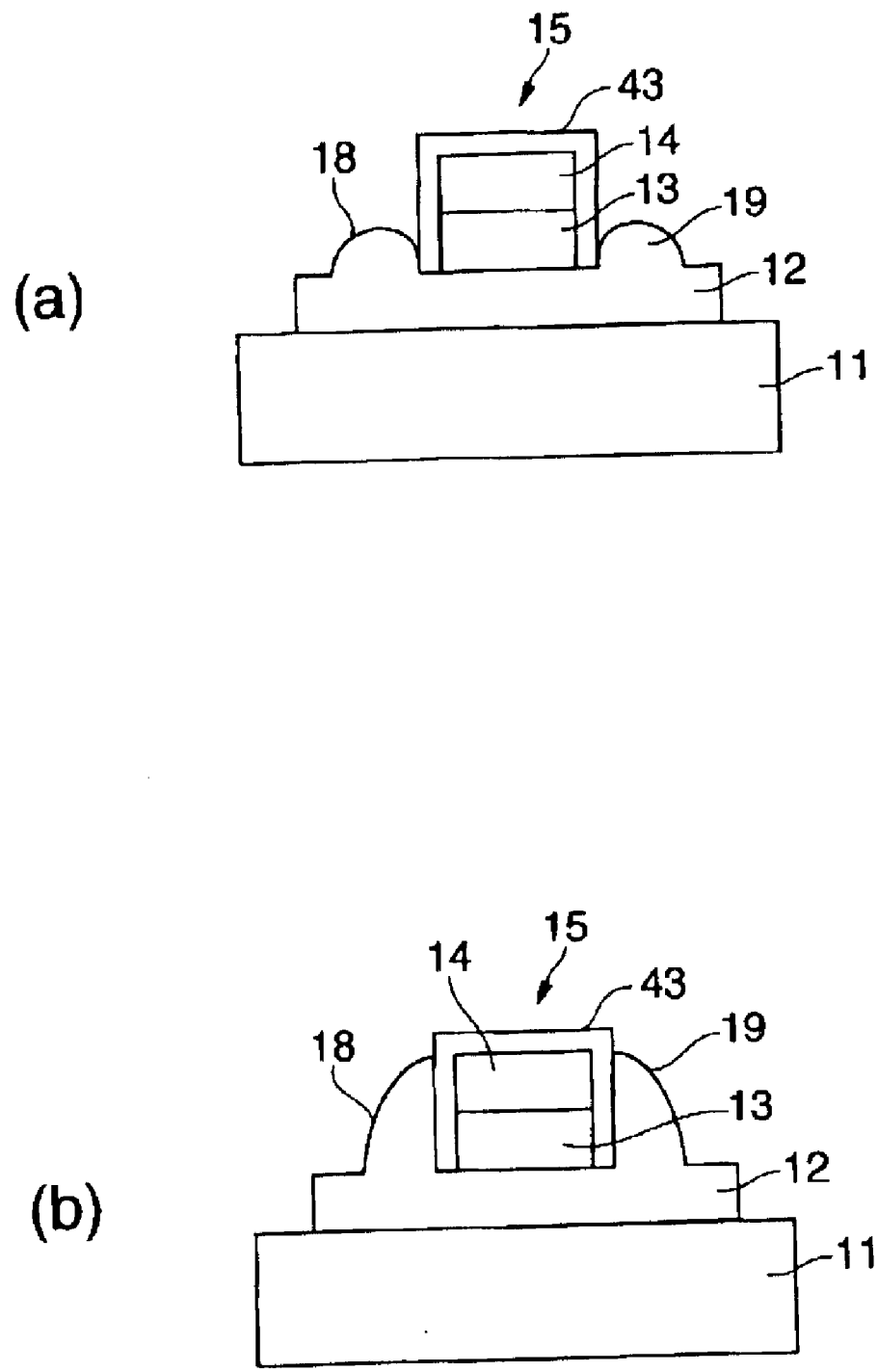
FIGS. 18a and 18b are views illustrating a preferred example, in which a source region and a drain region are formed.

In the structure shown in FIG. 18(*b*), the doped semiconductor film forming the source region 18 and the drain region 19 contacts with side walls of the gate electrode film 14 with the insulating film 43 therebetween. Therefore, a source/gate in-between parasitic capacitance and a gate/drain in-between parasitic capacitance were increased, which was not preferable. Accordingly, even in the case where isolation means was provided between a source and a gate in this example, it is preferable that the source region 18 and the drain region 19 be not the same in height as the gate electrode film 14 as shown in the figures of the respective examples and FIG. 18(*a*), in which a preferred example is shown.

The device obtained by the manufacture method of the invention, and hence a thin-film transistor can be utilized as a switching element for liquid crystal displays, or a drive element for organic EL (electroluminescence) displays.

Figure 19:
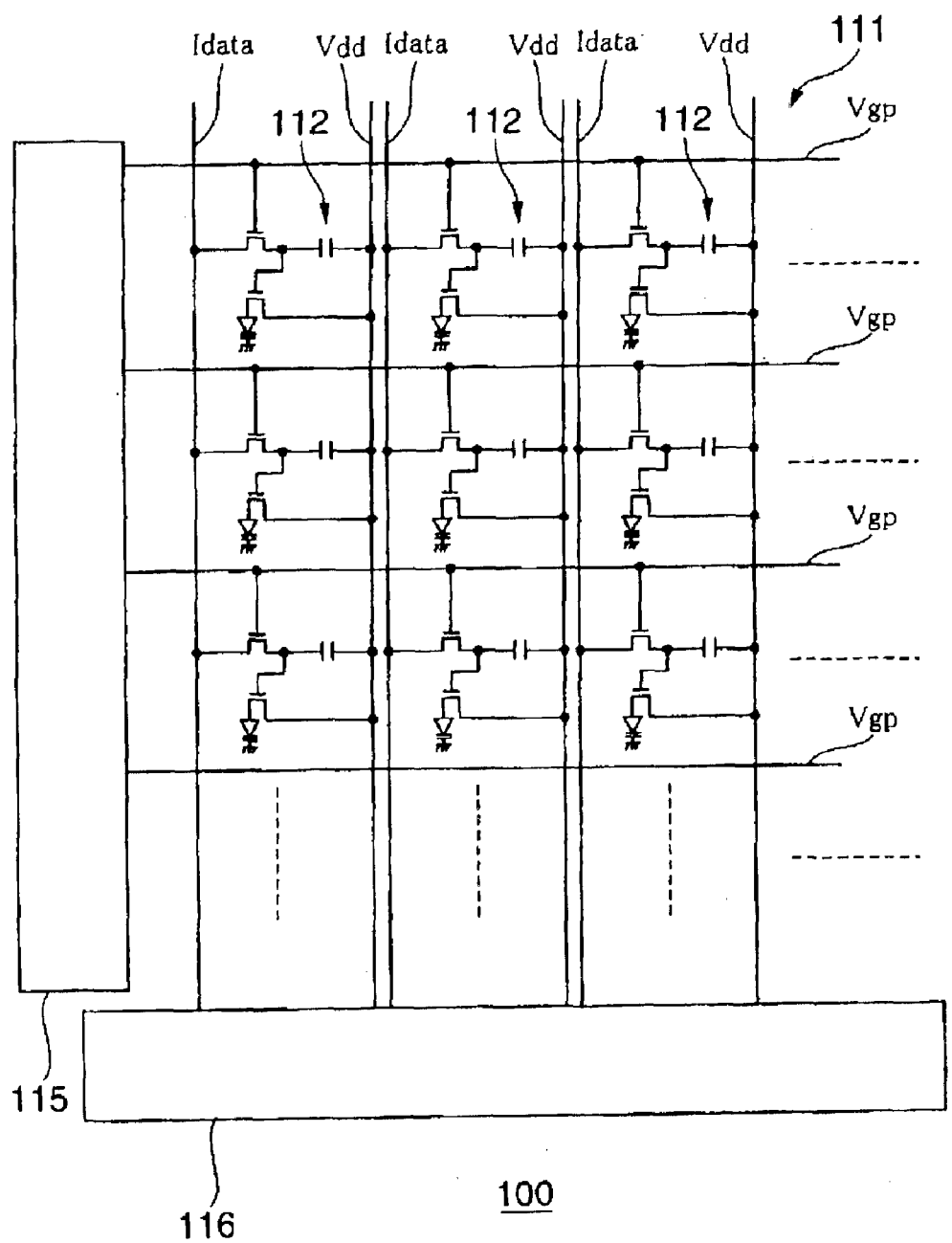
FIG. 19 is a view illustrating an example of an electro-optic device making use of a semiconductor device according to the invention.

FIG. 19 shows a circuit structure of a pixel region (display panel) 111 of an electro-optic device 100 driven by an active matrix system, and respective pixels 112 comprise a luminous layer capable of emission due to the electroluminescence effect, a retention volume for storing an electric current for driving the layer, and a thin-film transistor manufactured by the manufacture method of the invention. Selection signal conductors Vgp are fed to respective pixels from a scanning line driver 115. Signal conductors Idata and power conductors Vdd are fed to respective pixels from a data line driver 116. By controlling the selection signal conductors Vgp and the signal conductors Idata, a current program for respective pixels is performed and emission from luminous units OLED is controlled.

Figure 20:
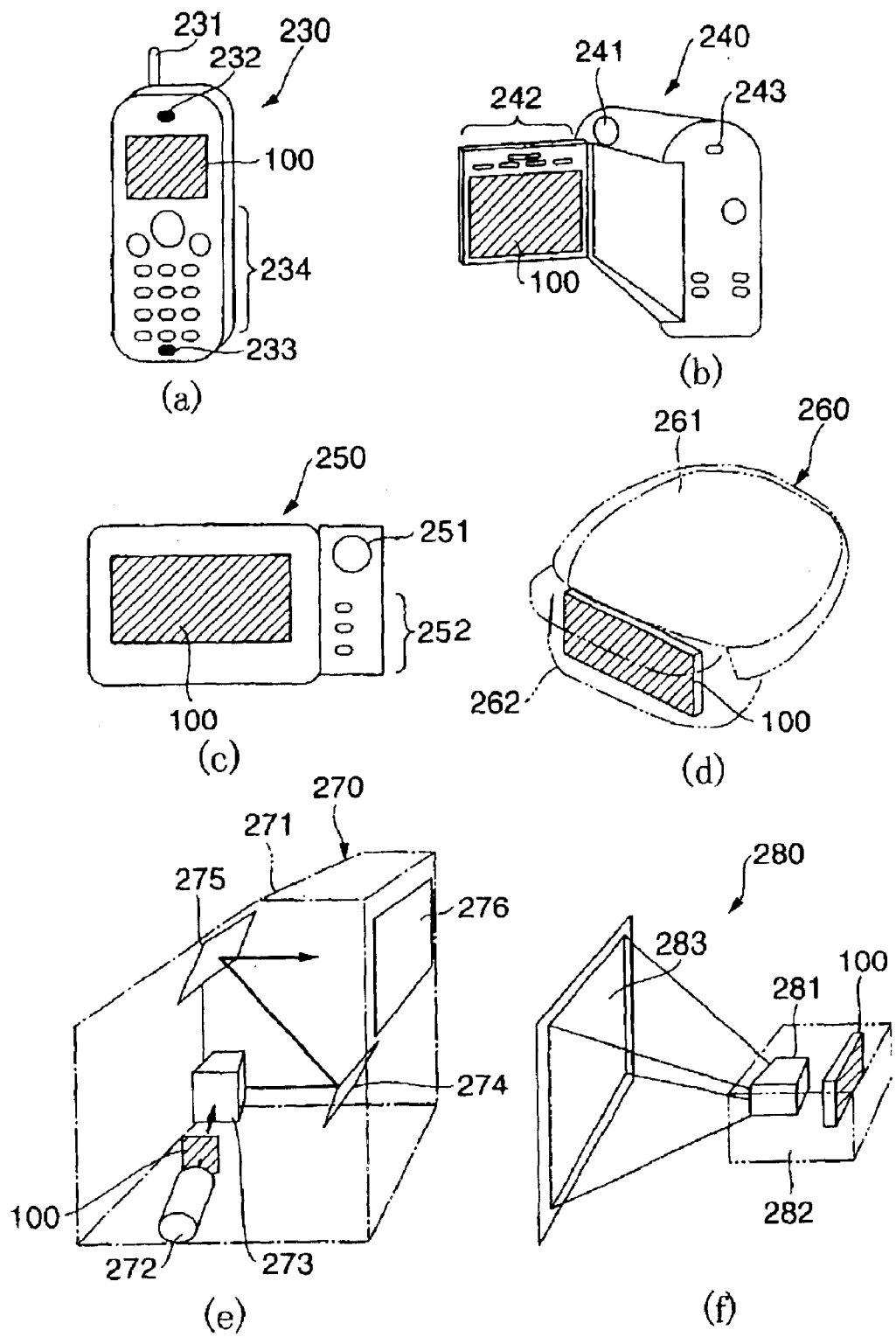
FIGS. 20a–20f are views illustrating electronic equipment making use of an electro-optic device.

The device obtained by the manufacture method of the invention is applicable to various electronic equipment provided with an electro-optic device. FIGS. 20(*a*) to 20(*f*) show examples of electronic equipment, to which the electro-optic device is applicable.

FIG. 20(*a*) shows an application to a portable telephone, the portable telephone 230 comprising an antenna unit 231, sound output unit 232, sound input unit 233, operation unit 234, and an electro-optic device 10 of the invention. In this manner, the electro-optic device 10 of the invention can be utilized as a display of the portable telephone 230.

FIG. 20(*b*) shows an application to a video camera, the video camera 240 comprising a television unit 241, operation unit 242, sound input unit 243, and an electro-optic device 10 of the invention. In this manner, the electro-optic device of the invention can be utilized as a finder or a display.

FIG. 20(*c*) shows an application to a portable personal computer, the personal computer 250 comprising a camera unit 251, operation unit 252, and an electro-optic device 10 of the invention. In this manner, the electro-optic device of the invention can be utilized as a display.

FIG. 20(*d*) shows an application to a headmount display, the headmount display 260 comprising a band 261, optical system storage unit 262, and an electro-optic device 10 of the invention. In this manner, the electro-optic device of the invention can be utilized as an image display source. FIG. 20(*e*) shows an application to a rear-type projector, the projector 270 comprising a housing 271, light source 272, composite optical system 273, mirror 274, mirror 275, screen 276, and an electro-optic device 10 of the invention. In this manner, the electro-optic device of the invention can be utilized as an image display source. FIG. 20(*f*) shows an application to a front-type projector, the projector 280 comprising a housing 282, optical system 281, and an electro-optic device 10 of the invention, and a screen 283 being capable of displaying an image. In this manner, the electro-optic device of the invention can be utilized as an image display source.

Being not limited to the above, the electro-optic device 10 of the invention is applicable to all electronic equipment, to which an active matrix type display is applicable. For example, the device can be made use of for facsimiles with a displaying function, finders for digital cameras, portable TVs, DSP devices, PDA, electronic notes, electronic bulletin boards, displays for propaganda and advertisement, and so on.

As described above, according to the embodiments of the invention, it is possible to manufacture devices without the need of large scale apparatuses such as ion implantation apparatuses, vacuum devices, plasma devices, and the like. Thereby, it is possible to expect reduction in manufacture cost.

Also, since a stopper insulating film is made use of to coat a doped silicon liquid to enable forming a source region and a drain region in self-alignment, it is possible to decrease parasitic capacitance between a source region and a gate electrode film, or between a drain region and a gate electrode film.

Also, with the structure in the examples, since a gate electrode film of a transistor is arranged below a semiconductor film and a source region and a drain region are formed on both sides of a stopper insulating film, which is arranged above the semiconductor film, in self-alignment, a channel width is substantially determined by the stopper insulating film.

In addition, components of a liquid semiconductor material can be appropriately prepared and are not limited to those in the examples. A silane of higher order obtained by polymerizing a cyclic silane compound with photoirradiation is easy to use for a silicon compound as the liquid semiconductor material. Photopolymerization may be made not only before coating but also after coating.

Effect of the Invention

As described above, according to the configuration of the invention, it is possible to form a highly concentrated doped semiconductor film in a source region and a drain region without the use of ion implantation apparatuses.

Also, a semiconductor film in channel portions and a semiconductor film in a source region and a drain region can be formed to be different in film thickness from each other. Thereby, ON current can be made large and OFF current can be made small by forming a semiconductor film in the channel portions uniformly thin. By forming a semiconductor film in a source region and a drain region to have the same large film thickness, resistance can be reduced and process margins at the time of formation of contact holes are enlarged. Due to this, a coated semiconductor film can ensure an adequate thickness even when over-etching at the time of formation of contact holes causes some etching on a semiconductor film in a source region and a drain region, so that it is possible to prevent an increase in resistance of portions about the source region and the drain region and an increase in contact resistance with an electrode.

The entire disclosure of Japanese Patent Application No. 2002-119964 filed Apr. 22, 2002 is incorporated by reference.

What is claimed is:

1. A method of manufacturing a device, comprising:
   a semiconductor film forming step of forming a semiconductor film on a substrate;
   a gate region forming step of forming a gate region, in which a gate insulating film formed on the semiconductor film and a gate electrode film are laminated;
   an isolation means forming step of forming isolation means on both sides of the gate region by forming a liquid repellent film on the semiconductor film and subsequently irradiating the liquid repellent film to remove the liquid repellent film from the semiconductor film except at the sides of the gate region, the isolation means preventing contact between the gate electrode film and other regions;
   a coating step of coating a liquid semiconductor material on regions on the substrate and on both sides of the gate region; and
   a source region and drain region forming step of forming a source region and a drain region from a coated film of the liquid semiconductor material.

2. The method of manufacturing a device according to claim 1, wherein the step of forming a source region and a drain region from the liquid semiconductor material comprises:
   a first heat treatment of relatively low temperature to remove a solvent from the coated film of the liquid semiconductor material, and
   a second heat treatment step, in which the coated film, from which the solvent has been removed, is subjected to at least one of photoirradiation and heat treatment at a higher temperature than that in the first heat treatment.

3. The method of manufacturing a device according to claim 2, wherein the source region and drain region forming step further comprises a third heat treatment step, in which the coated film having been subjected to heat treatment is improved in crystalline quality.

4. The method of manufacturing a device according to claim 1, wherein the liquid semiconductor material is coated by means of a droplet discharge method.

5. An electro-optic device comprising a device manufactured by the device manufacturing method according to claim 1.

6. An electronic equipment comprising an electro-optic device according to claim 5.

7. A method of manufacturing a semiconductor device comprising:
   a.) forming a semiconductor film on a substrate;
   b.) laminating a gate electrode film over a gate region and the semiconductor film;
   c.) isolating both sides of the gate region by forming a liquid repellent film on both sides of the gate region to prevent contact between the gate electrode film and other regions; and
   d.) forming a source region and a drain region from a liquid semiconductor material disposed on regions on the substrate and on both sides of the gate region;
   wherein the liquid repellent film repels the liquid semiconductor material from the gate electrode film to prevent electric contact between the source region, drain region, and gate electrode film.

8. The method according to claim 7, wherein step c.) further comprises forming an insulating film on both sides of the gate region.

9. The method according to claim 7, wherein step c.) further comprises forming an insulating film by anodizing the gate electrode film.

10. The method according to claim 7, wherein step c.) further comprises trenching portions of the semiconductor film on both sides of the gate region.

11. The method according to claim 7, wherein step c.) further comprises trenching portions of the substrate on both sides of the gate region.

12. The method according to claim 10, wherein the respective trenched portions form grooves, and the source region and the drain region are formed in the respective grooves.

13. The method according to claim 7, wherein the liquid semiconductor material contains a silane compound and a dopant source.

14. The method according to claim 7, wherein the liquid semiconductor material contains a silane of higher order obtained by irradiating ultraviolet rays on a solution of a silane compound to cause photopolymerization, and a dopant source.

15. The method according to claim 7, wherein the liquid semiconductor material contains a silane of higher order obtained by irradiating ultraviolet rays on a solution containing a silane compound and a dopant source.

16. The method according to claim 14, wherein the silane compound has at least one cyclic structure in molecules thereof.

17. The method according to claim 14, wherein the dopant source is a substance containing at least one of an element of group IIIB, and an element of group VB.

18. An electro-optic device comprising the device according to claim 7.

19. An electronic equipment comprising the electro-optic device according to claim 18.

* * * * *